(12) United States Patent  (10) Patent No.: US 6,232,842 B1
Asano  (45) Date of Patent: May 15, 2001

(54) AMPLIFYING CIRCUIT AND OPTICAL RECEIVER COMPRISING THE SAME

(75) Inventor: Hiroaki Asano, Katano (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/423,551

(22) PCT Filed: Mar. 11, 1999

(86) PCT No.: PCT/JP99/01168

§ 371 Date: Nov. 10, 1999

§ 102(e) Date: Nov. 10, 1999

(87) PCT Pub. No.: WO99/46853

PCT Pub. Date: Sep. 16, 1999

(30) Foreign Application Priority Data

Mar. 13, 1998 (JP) .................................................. 10-63725

(51) Int. Cl.[7] ..................................................... H03F 3/08

(52) U.S. Cl. ........................ 330/308; 327/62; 250/214 A

(58) Field of Search .................................... 330/279, 308; 250/214 A; 327/62, 58, 343, 330, 61

(56) References Cited

U.S. PATENT DOCUMENTS

| 4,994,692 | * | 2/1991 | Wolke | 307/494 |
|---|---|---|---|---|
| 5,430,766 | * | 7/1995 | Ota et al. . | |
| 5,875,049 | * | 2/1999 | Asano et al. | 359/189 |
| 6,000,616 | * | 12/1999 | Spitz | 235/462.16 |

FOREIGN PATENT DOCUMENTS 7-231307 * 8/1995 (JP) .

OTHER PUBLICATIONS

1997 IEEE, ISSCC97, Session 15, Serial Data Communications, Paper FP15.4.*
Patent Abstracts of Japan, Publication No. 10084231, dated Mar. 3, 1998.*
Patent Abstracts of Japan, Publication No. 09312528, dated Dec. 2, 1997.*
Patent Abstracts of Japan, Publication No. 08084160, dated Mar. 26, 1996.*

* cited by examiner

Primary Examiner—Robert Pascal
Assistant Examiner—Henry Choe
(74) Attorney, Agent, or Firm—Wenderoth, Lind & Ponack, LLP.

(57) ABSTRACT

A first differential amplifier amplifies an input signal and differential-outputs an amplified result in the form of a positive-phase output and a negative-phase output. First and second peak detecting parts respectively detect and store peak values of the positive-phase and negative-phase outputs of the first differential amplifier. A second differential amplifier amplifies a difference between outputs of the first and second peak detecting parts and then differential-outputs an amplified result in the form of a positive-phase output and a negative phase output. The positive-phase and negative-phase outputs of the second differential amplifier coincide with center values of the positive-phase and negative-phase outputs of the first differential amplifier, respectively. A combined differential amplifier amplifies a difference $\{(V_{S1}-V_{R1})-(V_{S2}-V_{R2})\}$ between a difference $(V_{S1}-V_{R1})$ of a first input signal $(V_{S1})$ and a fit reference signal $(V_{R1})$ and a difference $(V_{S2}-V_{R2})$ of a second input signal $(V_{S2})$ and a second reference signal $(V_{R2})$. The first and second input signals are assigned to the positive-phase and negative-phase outputs of the first differential amplifier, respectively. The first and second reference signals are assigned to the positive-phase and negative-phase outputs of the second differential amplifier, respectively. Preferably, an output value of the first differential amplifier receiving no signal input and an output value of the second differential amplifier receiving no signal input are set to be equal.

33 Claims, 14 Drawing Sheets

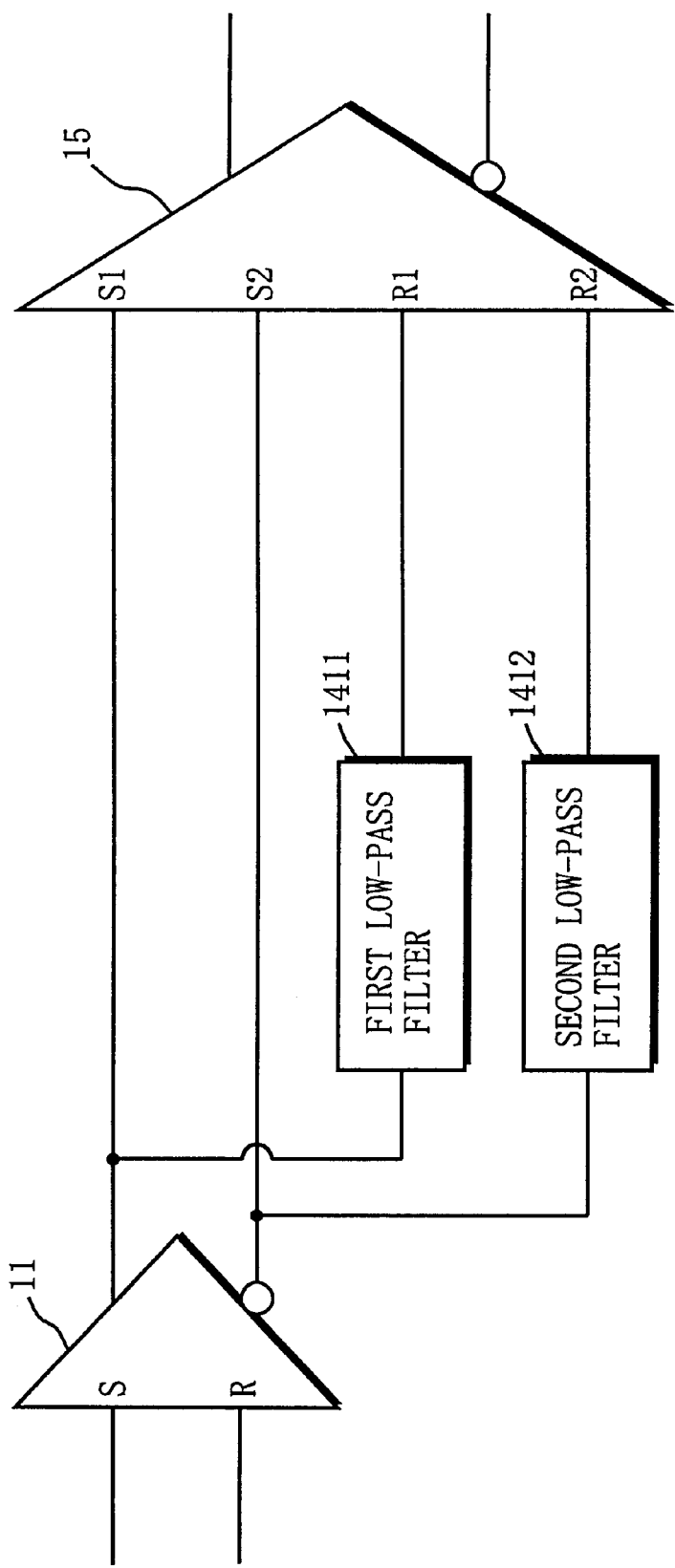
F I G. 1 4

AMPLIFYING CIRCUIT AND OPTICAL RECEIVER COMPRISING THE SAME

TECHNICAL FIELD

The present invention relates to amplifying circuits and optical receivers using the same, more particularly to an amplifying circuit amplifying a mono-polarity input signal to convert the same into a bi-polarity signal and an optical receiver using such amplifying circuit.

BACKGROUND ART

Recently, there have been increasing demands for handling a burst signal (a signal which intermittently appears) on an optical transmission path in the fields of optical subscriber system and optical interconnection system.

When the burst signal is handled, the frequency of appearing "1" and "0" on the transmission path generally has a wide range of variation. Therefore, an optical receiver handling the burst signal is required to employ the DC coupling system. When the DC coupling system is employed in a circuit, however, such problem comes up that varying temperature and varying power-supply voltage make an operating point of the circuit susceptible to the variations, thereby rendering the circuit difficult to stably amplify.

Moreover, in an optical transmission system utilizing a baseband digital signal, binary information of "1" and "0" is transmitted. Therefore, the system utilizes the presence or absence of optical signals for a modulated optical signal. If this optical signal is converted into an electric signal by an optical-to-electrical conversion device, the electric signal takes a form of mono-polarity signal which occurs on either side (of "+" or "−") when a value of "1" appears with reference to a value of "0". In order to correctly distinguish between a value of "1" and a value of "0", the distinguishing value should be set exactly equal to a center value thereof when the electric signal is converted into a pulse signal. In a system in which a signal occurs in a burst manner, by converting a mono-polarity signal, in accordance with the presence and absence of signal, into a bi-polarity signal having an amplitude component in both directions of "+" and "−" with reference to an output level when there is no signal input. As a result, in a case where a noise is superimposing on the signal, values of "0" and "1" can be distinguished from each other with an almost-equal probability by referring to the aforementioned output level when there is no signal input.

Furthermore, when the converted bi-polarity signal is further amplified with reference to the aforementioned output level when there is no signal input, information on the changing points from "1" to "0" and from "0" to "1" are stored, whereby distortion of pulse width can be suppressed. Moreover, even if each burst signal is different in input optical power level, pulse can be precisely reproduced.

Hereinafter, a conventional optical receiver in which a mono-polarity signal is converted into a bi-polarity signal and the DC coupling system is employed is described.

A first conventional example of an optical receiver in which the DC coupling system is employed is described in IEEE ISSCC97 FP15.4. In this optical receiver, an output signal of a transimpedance-type preamplifier having a photodiode connected is inputted into a maximum value storing circuit and a minimum value storing circuit a center value of output of the respective circuits is generated in a resistance voltage dividing circuit, Sand the output signal of the aforementioned preamplifier is amplified by using a limiter amplifier with reference to the generated center value. Thereafter, a plurality of amplifying parts constituted by the maximum value storing circuit, the minimum value storing circuit, and the limiter amplifier are connected in series so that the pulse signal can be reproduced.

In the above-described first conventional example, however, the maximum value storing circuit and the minimum value storing circuit cannot be structurally the same in most cases, and thus each of the circuits has its own characteristics of temperature variation. As a result, a reference voltage to signal input of the limiter amplifier is influenced, it accordingly gets difficult to use the optical receiver in a wide range of temperature. Further, when each of the maximum value storing circuit and the minimum value storing circuit has an offset, these offsets cannot be cancelled. Therefore, the reference voltage to signal input of the limiter amplifier is also influenced, and consequently it gets difficult for the optical receiver to stably amplify.

Next, as a second conventional example of the optical receiver in which the DC coupling system is employed, the optical receiver disclosed in U.S. Pat. No. 5,430,766 is described. This optical receiver is constituted by a circuit whose main components are a preamplifier having a differential amplifier and another differential amplifier connected in the following stage.

In the aforementioned second conventional example, an output of peak detecting part on the positive side of differential output signal is fed back to determine a reference input level of the differential amplifier constituting the preamplifier. If temperature variation or power-supply voltage variation is observed, this output variation of the peak detecting part affects reference input in the preamplifier. Therefore, it becomes difficult to precisely reproduce a signal in a wide range of temperature. Further, if a noise is mixed in a signal line, the peak detecting part might respond to the noise and store an inaccurate peak value. Also in this case, it is difficult to precisely reproduce a signal. In this example, in order to avoid an influence to be caused by background light, feedback control is realized, which controls a current source to eliminate an obtained difference of peak values of differential outputs of the preamplifier. However, as two feedback loops are resultantly required, it is difficult to optimally set time constants of the respective feed back loops.

A third conventional example is the optical receiver disclosed in Japanese Patent Laying-Open No. 7-231307. This optical receiver amplifies, in a differential amplifier, an output from a preamplifier to which a photodiode is connected and a signal from a reference voltage source which outputs a value being almost equal to an output signal level of the preamplifier, and inputs a positive-phase output and a negative-phase output of the differential amplifier respectively into identically-structured maximum value storing circuits so as to detect and store each maximum value thereof. Thereafter, the optical receiver extracts a difference of these maximum values, multiplies the difference by 0.5, and adds the multiplied value to an output of center value generating part of differential output. This added value is treated as reference input of a comparator to be connected in the following stage. A pulse signal is thus reproduced by inputting the positive-phase output of the differential amplifier into signal input of the comparator.

In the aforementioned third conventional example, by using two identically-structured maximum value storing circuits and by extracting a difference thereof, offsets and characteristics of temperature variation in the maximum value storing circuits can be cancelled. According to the third conventional example, however, a center value cannot be precisely generated in some cases due to varying device (resistance devices) constants used in the center value generating part which generates the center value between the positive-phase output and the negative-phase output of the differential amplifier. In these cases, a reference signal of the comparator is deviated from a correct center value of differential output, whereby a pulse width of the reproduced pulse signal might be distorted. Moreover, if a noise is superimposed on a power-supply line or a ground line, a noise superimposing on an output and a noise component superimposing on a reference signal in the differential amplifier cannot be generally coincided with each other. Therefore, reproduction of a pulse signal may not be correctly accomplished by the comparator.

A fourth conventional example is the optical receiver disclosed in Japanese patent Laying-Open No. 9-289495 (U.S. application corresponding thereto Ser. No. 08/803, 927). This optical receiver detects and stores each maximum value of positive-phase output and negative-phase output of a differential amplifier for amplifying signals, and generates a reference signal with respect to a positive-phase output signal of the differential amplifier for amplifying signals via an amplifier for reference signals having an amplification factor of 0.5. The differential amplifier for amplifying signals and the amplifier for reference signals are provided with identically-structured current sources and load resistors so that an output voltage of the amplifier for reference signals which is receiving no signal input and an output voltage of the differential amplifier for amplifying signals which is receiving no signal input can be set equal. In this system, by using identically-structured two maximum value storing circuits and by extracting a difference thereof, offsets and temperature variation in the maximum value storing circuits can be cancelled. Moreover, this system does not require the center value generating part required in the third conventional example, and thus a transmission path for signals is free from connection. Therefore, the signals can be amplified without causing deterioration of frequency characteristics.

According to the foregoing fourth conventional example, the differential amplifier for amplifying signals and the amplifier for reference signals are provided with the identically-structured current sources and load resistors so as to coincide the respective offset voltages when there is no signal input. However, an error of the offset voltages caused by variations in device constants cannot be cancelled. Therefore, if the error of the offset voltage is conspicuous, reproduction of pulse signal taken place in the comparator to be connected in the last stage might suffer a bad influence.

DISCLOSURE OF THE INVENTION

Therefore, an object of the present invention is to provide an amplifying circuit and optical receiver in which a monopolarity signal is precisely amplified and converted into a bi-polarity signal at all times regardless of varying offsets resulted in varied ambient temperature, varied power-supply voltage, mixed noise from a power-supply or the like and variation in device constants, or under an operating environment disturbed by background light.

The present invention has the following features to attain the object above.

A first aspect of the present invention is directed to an amplifying circuit converting a mono-polarity input signal into a bi-polarity signal and amplifying the same, the amplifying circuit comprises:

a first amplifier amplifying the mono-polarity input signal, and differential-outputting the amplified result in the form of positive-phase output and negative-phase output;

a center value generating part generating a center value of the positive-phase output and a center value of the negative-phase output of the first amplifier, and outputting the respective center values as a first and second center values; and a second amplifier having a function of amplifying a difference $\{(V_{S1}-V_{R1})-(V_{S2}-V_{R2})\}$ between a difference $(V_{S1}-V_{R1})$ of a first input signal $(V_{S1})$ and a first reference signal $(V_{R1})$ and a difference $(V_{S2}-V_{R2})$ of a second input signal $(V_{S2})$ and a second reference signal $(V_{R2})$, wherein the first input signal is assigned the positive-phase output of the first amplifier, the first reference signal is assigned the first center value, the second input signal is assigned the negative-phase output of the first amplifier, and the second reference signal is assigned the second center value.

As described in the foregoing, according to the first aspect, both the positive-phase output and the negative-phase output of the first amplifier are utilized to further amplify the result amplified in the first amplifier in the second amplifier. Therefore, a common-mode noise component superimposing on a differential output of the first amplifier can be cancelled in the second amplifier. Consequently, an influence to be caused by a noise superimposing on a power-supply line or ground line can be eliminated.

A second aspect of the present invention is directed to the amplifying circuit depending on the first aspect, characterized in that the center value generating part includes:

a first peak detector detecting and storing a peak value of the positive-phase output of the first amplifier;

a second peak detector detecting and storing a peak value of the negative-phase output of the first amplifier; and a third amplifier amplifying a difference between an output of the first peak detector and an output of the second peak detector and differential-outputting the amplified result in the form of positive-phase output and negative-phase output, wherein the first center value is extracted from the positive-phase output of the third differential amplifier and the second center value is extracted from the negative-phase output thereof.

As described in the foregoing, according to the second aspect, by using the first and second peak value detectors and the third amplifier, the first and second center values can be correctly generated with a simplified structure. Moreover, the positive-phase output and the negative-phase output of the third are utilized as the first center value and the second center value. Therefore, even when a slight offset is respectively included in output voltages of the first amplifier and the third amplifier receiving no signal input, the offset components are balanced to each other in the second amplifier, thereby rendering an influence to be caused by the offset components smaller.

A third aspect of the present invention is directed to the amplifying circuit depending on the second aspect, characterized in that a value of positive-phase output and negative-phase output of the first amplifier receiving no signal input and a value of positive-phase output and negative-phase output of the third amplifier receiving no signal input are set to be equal.

As described in the foregoing, according to the third aspect, a value of the positive-phase output and the negative-phase output of the first amplifier receiving no signal input, a value of the positive-phase output and the negative-phase output of the third amplifier receiving no signal input, and the positive-phase output and the negative-phase output of the third amplifier are set equal. Therefore, offsets respectively occur in the first amplifier and the second amplifier can be almost perfectly cancelled in the second amplifier.

A fourth aspect of the present invention is directed to the amplifying circuit depending on the third aspect, characterized in that an amplification factor of the positive-phase output with respect to a differential input of the third amplifier and an amplification factor of the negative-phase output with respect to the differential input of the third amplifier are both set around 0.5.

As described in the foregoing, according to the fourth aspect, the positive-phase output level of the third amplifier can be set exactly equal to the center value of the positive-phase output of the first amplifier, and the negative-phase output level of the third differential amplifier can be set equal to the center value of the negative-phase output of the first differential amplifier. Therefore, the second amplifier can execute amplification in an accurate manner, whereby signals can be correctly reproduced.

A fifth aspect of the present invention is directed to the amplifying circuit depending on the fourth aspect, characterized in that the first amplifier at least comprises:

a first and second transistors whose sources are connected to each other;

a first current source which is connected to the connected-to-each-other sources of the first and second transistors;

a first resistor interposed between a drain of the first transistor and a power-supply line; and a second resistor interposed between a drain of the second transistor and a power-supply line, and the third amplifier at least comprises:

a third and fourth transistors;

a second current source;

a third resistor interposed between a source of the third transistor and the second current source;

a fourth resistor interposed between a source of the fourth transistor and the second current source;

a fifth resistor interposed between a drain of the third transistor and a power-supply line; and a sixth resistor interposed between a drain of the fourth transistor and a power-supply line, wherein when a product of a resistance value of the first resistor and a current value set in the first current source is P1, a product of a resistance value of the second resistor and a current value set in the first current source is P2, a product of a resistance value of the fifth resistor and a current value set in the second current source is P3, and a product of a resistance value of the sixth resistor and a current value set in the second current source is P4, resistance values of the first, second, fifth and sixth resistors and current values set in the first and second current sources are selected to satisfy an equation of $$P1=P2=P3=P4.$$

As described in the foregoing, according to the fifth aspect, by equalizing products of the resistance values of resistors and the current values set in the current sources with one another, an output level of the first amplifier receiving no differential input and an output level of the third amplifier receiving no differential input can be equal.

A sixth aspect of the present invention is directed to the amplifying circuit depending on the fifth aspect, characterized in that resistance values of the first, second, fifth and sixth resistors are selected to be equal to one another, resistance values of the third and fourth resistors are selected to be equal to each other, and the current value set in the first current source and the current value set in the second current source are selected to be equal to each other.

As described in the foregoing, according to the sixth aspect, as device constants are equalized, output variation of the first amplifier and output variation of the third amplifier resulted in varying temperature and varying power-supply voltage can be put to vary in a similar manner. Consequently, an amplifier having a resistance to environment can be provided.

A seventh aspect of the present invention is directed to the amplifying circuit depending on the second aspect, characterized in that circuit structures of the first and second peak detectors are identical to each other.

As described in the foregoing, according to the seventh aspect, the circuit structures of the first and second peak detectors are identical to each other. Therefore, by taking a difference of the outputs of these peak detecting circuits in the third amplifier, an error component of the outputs of these peak detecting circuits can be cancelled.

An eighth aspect of the present invention is directed to the amplifying circuit depending on the first aspect, characterized in that the center value generating part comprises:

a first low-pass filter passing only a low-frequency component of the positive-phase output of the first amplifier; and a second low-pass filter passing only a low-frequency component of the negative-phase output of the first amplifier.

As described in the foregoing, according to the eighth aspect, the first and second center values can be obtained with a simplified structure.

A ninth aspect of the present invention is directed to the amplifying circuit depending on the first aspect, characterized in that the first amplifier comprises a differential amplifier receiving the mono-polarity input signal as signal input, receiving a fixed voltage temporarily set with respect to a direct-current level of the input signal as reference input, and differential-amplifying the input signal in accordance with the fixed voltage.

A tenth aspect of the present invention is directed to an amplifying circuit converting a mono-polarity input signal into a bi-polarity signal and amplifying the same, the amplifying circuit comprises:

a plurality of basic amplifying parts to be cascade-connected in multiple stages; and a first amplifier cascade-connected to a last basic amplifying part, having a function of amplifying a difference $\{(V_{S1}-V_{R1})-(V_{S2}-V_{R2})\}$ between a difference $(V_{S1}-V_{R1})$ of a first input signal $(V_{S1})$ and a first reference signal $(V_{R1})$ and a difference $(V_{S2}-V_{R2})$ of a second input signal $(V_{S2})$ and a second reference signal $(V_{R2})$, and differential-outputting the amplified result in the form of positive-phase output and negative-phase output, and each of the basic amplifying parts comprising:

a second amplifier having a function of amplifying a difference $\{(V_{S1}-V_{R1})-(V_{S2}-V_{R2})\}$ between a difference ($V_{S1}-V_{R1}$) of a first input signal ($V_{S1}$) and a first reference signal ($V_{R1}$) and a difference ($V_{S2}-V_{R2}$) of a second input signal ($V_{S2}$) and a second reference signal ($V_{R2}$), and differential-outputting the amplified result in the form of positive-phase output and negative-phase output; and a center value generating part generating a center value of the positive-phase output and a center value of the negative-phase output of the first amplifier, and outputting the respective center values as a first and second center values, wherein the second amplifier in a first basic amplifying part differential-amplifies the mono-polarity input signal, the second amplifier in a second basic amplifying part and thereafter receives a positive-phase output and a negative-phase output of the second amplifier in the preceding basic amplifying part as the first and second input signals, and receives the first and second center values outputted from the center value generating part in the preceding basic amplifying part as the first and second reference signals, respectively, and the first amplifier receives a positive-phase output and a negative-phase output of the second amplifier in the last basic amplifying part as the first and second input signals, respectively, and receives the first and second center values outputted from the center value generating part in the last basic amplifying part as the first and second reference signals, respectively.

As described in the foregoing, according to the tenth aspect, by cascade-connecting a plurality of basic amplifying parts, a very small signal can be amplified while sufficiently reducing an offset component.

An eleventh aspect of the present invention is directed to the amplifying circuit depending on the tenth aspect, characterized in that the center value generating part provided in each of the basic amplifying parts comprises:

a first peak detector detecting and storing a peak value of the positive-phase output of the second amplifier;

a second peak detector detecting and storing a peak value of the negative-phase output of the second amplifier; and a third amplifier amplifying a difference between an output of the first peak detector and an output of the second peak detector, and differential-outputting the amplified result in the form of positive-phase output and negative-phase output, wherein the first center value is extracted from the positive-phase output of the third differential amplifier and the second center value is extracted from the negative-phase output thereof.

As described in the foregoing, according to the eleventh aspect, by using the first and second peak value detectors and the third amplifier, the first and second center values can be correctly generated with a simplified structure. Moreover, the positive-phase output and the negative-phase output of the third are utilized as the first center value and the second center value. Therefore, even when a slight offset is respectively included in output voltages of the first amplifier and the second amplifier receiving no signal input, the offset components are balanced to each other in the second amplifier, thereby rendering an influence to be caused by the offset components smaller.

A twelfth aspect of the present invention is directed to the amplifying circuit depending on the eleventh aspect, characterized in that a value of positive-phase output and negative-phase output of the second amplifier receiving no signal input and a value of positive-phase output and negative-phase output of the third amplifier receiving no signal input are set to be equal.

As described in the foregoing, according to the twelfth aspect, a value of the positive-phase output and the negative-phase output of the first amplifier receiving no signal input, a value of the positive-phase output and the negative-phase output of the third amplifier receiving no signal input, and the positive-phase output and the negative-phase output of the third amplifier are set equal. Therefore, offsets respectively occur in the first amplifier and the second amplifier can be almost perfectly cancelled in the second amplifier in the following stage.

A thirteenth aspect of the present invention is directed to the amplifying circuit depending on the twelfth aspect, characterized in that an amplification factor of the positive-phase output with respect to a differential input of the third amplifier and an amplification factor of the negative-phase output with respect to the differential input of the third amplifier are both set around 0.5.

As described in the foregoing, according to the thirteenth aspect, the positive-phase output level of the third amplifier can be set exactly equal to the center value of the positive-phase output of the first amplifier, and the negative-phase output level of the third differential amplifier can be set equal to the center value of the negative-phase output of the first differential amplifier. Therefore, the second amplifier in the following stage can execute amplification in an accurate manner, whereby signals can be correctly reproduced.

A fourteenth aspect of the present invention is directed to the amplifying circuit depending on the eleventh aspect, characterized in that circuit structures of the first and second peak detectors are identical to each other.

As described in the foregoing, according to the fourteenth aspect, the circuit structures of the first and second peak detectors are identical to each other. Therefore, by taking a difference of the outputs of these peak detecting circuits in the third amplifier, an error component of the outputs of these peak detecting circuits can be cancelled.

A fifteenth aspect of the present invention is directed to the amplifying circuit depending on the tenth aspect, characterized in that the center value generating part provided in each of the basic amplifying parts comprises:

a first low-pass filter passing only a low-frequency component of the positive-phase output of the first amplifier; and a second low-pass filter passing only a low-frequency component of the negative-phase output of the first amplifier.

As described in the foregoing, according to the fifteenth aspect, the first and second center values can be obtained with a simplified structure.

A sixteenth aspect of the present invention is directed to an optical receiver converting an optical signal into an electric signal and amplifying the same, the optical receiver comprises:

an optical-to-electrical conversion device converting the optical signal into a current signal;

a preamplifier converting an output signal of the optical-to-electrical conversion device into a voltage signal;

an average value outputting part outputting an average value of output signal of the preamplifier;

a first amplifier amplifying a difference between an output of the preamplifier and an output of the average value outputting part, and differential-outputting the amplified result in the form of positive-phase output and negative-phase output;

a center value generating part generating a center value of the positive-phase output and a center value of the negative-phase output of the first amplifier, and outputting the center values as a first and second center values, respectively; and a second amplifier having a function of amplifying a difference $\{(V_{S1}-V_{R1})-(V_{S2}-V_{R2})\}$ between a difference $(V_{S1}-V_{R1})$ of a first input signal $(V_{S1})$ and a first reference signal $(V_{R1})$ and a difference $(V_{S2}-V_{R2})$ of a second input signal $(V_{S2})$ and a second reference signal $(V_2)$ wherein the first input signal is assigned the positive-phase output of the first differential amplifier, the first reference signal is assigned the first center value, the second input signal is assigned the negative-phase output of the differential amplifier, and the second reference signal is assigned the second center value.

As described in the foregoing, according to the sixteenth aspect, both the positive-phase output and the negative-phase output of the first amplifier are utilized to further amplify the result amplified in the first amplifier in the second amplifier. Therefore, a common-mode noise component superimposing on a differential output of the first amplifier can be cancelled in the second amplifier. As a result, even when a noise component is superimposing on a power-supply line or ground line, signals can be correctly reproduced. Further, even when the output of the average value generating part includes an offset component with respect to the output signal of the preamplifier, signals can be correctly reproduced.

A seventeenth aspect of the present invention is directed to the optical receiver depending on the sixteenth aspect, characterized in that the center value generating part comprises:

a first peak detector detecting and storing a peak value of the positive-phase output of the first amplifier;

a second peak detector detecting and storing a peak value of the negative-phase output of the first amplifier; and a third amplifier amplifying a difference between an output of the first peak detector and an output of the second peak detector, and differential-outputting the amplified result in the form of positive-phase output and negative-phase output, wherein the first center value is extracted from the positive-phase output of the third differential amplifier and the second center value is extracted from the negative-phase output thereof.

As described in the foregoing, according to the seventeenth aspect, by using the first and second peak value detectors and the third amplifier, the first and second center values can be correctly generated with a simplified structure. Moreover, the positive-phase output and the negative-phase output of the third are utilized as the first center value and the second center value. Therefore, even when a slight offset is respectively included in output voltages of the first amplifier and the second amplifier receiving no signal input, the offset components are balanced to each other in the second amplifier, thereby rendering an influence to be caused by the offset components smaller.

An eighteenth aspect of the present invention is directed to the optical receiver depending on the seventeenth aspect, characterized in that a value of positive-phase output and negative-phase output of the first amplifier receiving no signal input and a value of positive-phase output and negative-phase output of the third amplifier receiving no signal input are set to be equal.

As described in the foregoing, according to the eighteenth aspect, a value of the positive-phase output and the negative-phase output of the first amplifier receiving no signal input, a value of the positive-phase output and the negative-phase output of the third amplifier receiving no signal input, and the positive-phase output and the negative-phase output of the third amplifier are set equal. Therefore, offsets respectively occur in the first amplifier and the second amplifier can be almost perfectly cancelled in the second amplifier.

A nineteenth aspect of the present invention of the present invention is directed to the optical receiver depending on the eighteenth aspect, characterized in that an amplification factor of the positive-phase output with respect to a differential input of the third amplifier and an amplification factor of the negative-phase output with respect to the differential input of the third amplifier are both set around 0.5.

As described in the foregoing, according to the nineteenth aspect, the positive-phase output level of the third amplifier can be set exactly equal to the center value of the positive-phase output of the first amplifier, and the negative-phase output level of the third differential amplifier can be set equal to the center value of the negative-phase output of the first differential amplifier. Therefore, the second amplifier can execute amplification in an accurate manner, whereby signals can be correctly reproduced.

A twentieth aspect of the present invention is directed to the optical receiver depending on the nineteenth aspect, characterized in that;

the first amplifier at least comprises:

a first and second transistors whose sources are connected to each other;

a first current source which is connected to the connected-to-each-other sources of the first and second transistors;

a first resistor interposed between a drain of the first transistor and a power-supply line; and a second resistor interposed between a drain of the second transistor and a power-supply line, wherein the third amplifier at least comprises:

a third and fourth transistors;

a second current source;

a third resistor interposed between a source of the third transistor and the second current source;

a fourth resistor interposed between a source of the fourth transistor and the second current source;

a fifth resistor interposed between a drain of the third transistor and a power-supply line; and a sixth resistor interposed between a drain of the fourth transistor and a power-supply line, wherein when a product of a resistance value of the first resistor and a current value set in the first current source is P1, a product of a resistance value of the second resistor and a current value set in the first current source is P2, a product of a resistance value of the fifth resistor and a current value set in the second current source is P3, and a product of a resistance value of the sixth resistor and a current value set in the second current source is P4, resistance values of the first, second, fifth and sixth resistors and current values set in the first and second current sources are selected to satisfy an equation of $$P1=P2=P3=P4.$$

As described in the foregoing, according to twentieth aspect, by equalizing products of the resistance values of resistors and the current values set in the current sources with one another, an output level of the first amplifier receiving no differential input and an output level when the third amplifier has no differential input can be equal.

A twenty-first aspect of the present invention is directed to the optical receiver depending on the twentieth aspect, characterized in that resistance values of the first, second, fifth and sixth resistors are selected to be equal to one another, the resistance values of the third and fourth resistors are selected to be equal to each other, and the current value set in the first current source and the current value set in the second current source are selected to be equal to each other.

As described in the foregoing, according to the twenty-first aspect, as device constants are equalized, output variation of the first amplifier and output variation of the third amplifier resulted in varying temperature and varying power-supply voltage can be put to vary in a similar manner. Consequently, an amplifier having a resistance to environment can be provided.

A twenty-second aspect of the present invention is directed to the optical receiver depending on the seventeenth aspect, characterized in that circuit structures of the first and second peak detectors are identical to each other.

As described in the foregoing, according to the twenty-second aspect, the circuit structures of the first and second peak detectors are identical to each other. Therefore, by taking a difference of the outputs of these peak detecting circuits in the third amplifier, an error component of the outputs of these peak detecting circuits can be cancelled.

A twenty-third aspect of the present invention is directed to the optical receiver depending on the sixteenth aspect, characterized in that the center value generating part comprises:

a first low-pass filter passing only a low-frequency component of the positive-phase output of the first amplifier; and a second low-pass filter passing only a low-frequency component of the negative-phase output of the first amplifier.

As described in the foregoing, according to the twenty-third aspect, the first and second center values can be obtained with a simplified structure.

A twenty-fourth aspect of the present invention is directed to the optical receiver depending on the sixteenth aspect, characterized in that the second amplifier differential-outputs the amplified result in the form of positive-phase output and negative-phase output, and further comprises a comparator forming the result amplified by the second amplifier into a digital waveform by treating either the positive-phase output or the negative-phase output of the second amplifier as a threshold value to discriminate from the other.

As described in the foregoing, according to the twenty-fourth aspect, both phases (that is, the positive-phase output and the negative-phase output) of the bi-polarity signal outputted from the second amplifier are respectively provided as signal input and reference input of the comparator so as to perform pulse reproduction. With such structure, means for newly generating a reference signal becomes unnecessary, and a circuit can be accordingly downsized. Furthermore, a common-mode noise component superimposing on each phase output can be eliminated, and an influence to be caused by a noise component generating in the amplifier and superimposing on each phase output signal can be reduced. Therefore, a resistance to a noise can be improved.

A twenty-fifth aspect of the present invention is directed to an optical receiver converting an optical signal into an electric signal and amplifying the same, the optical receiver comprises:

an optical-to-electrical conversion device converting the optical signal into a current signal;

a preamplifier extracting an output signal of the optical-to-electrical conversion device as a differential voltage signal between a positive-phase output and a negative-phase output;

a first amplifier amplifying a difference between the positive-phase output and the negative-phase output of the preamplifier, and then differential-outputting the amplified result in the form of positive-phase output and negative-phase output;

a center value generating part generating a center value of the positive-phase output of the first amplifier and a center value of the negative-phase output thereof and outputting the same as a first and second center values, respectively; and a second amplifier having a function of amplifying a difference $\{(V_{S1}-V_{R1})-(V_{S2}-V_{R2})\}$ between a difference $(V_{S1}-V_{R1})$ of a first input signal $(V_{S1})$ and a first reference signal $(V_{R1})$ and a difference $(V_{S2}-V_{R2})$ of a second input signal $(V_{S2})$ and a second reference signal $(V_{R2})$ wherein the first input signal is assigned the positive-phase output of the differential amplifier, the first reference signal is assigned the first center value, the second input signal is assigned the negative-phase output of the differential amplifier, and the second reference signal is assigned the second center value.

As described in the foregoing, according to the twenty-fifth aspect, both the positive-phase output and the negative-phase output of the first amplifier are utilized to further amplify the result amplified in the first amplifier in the second amplifier. Therefore, a common-mode noise component superimposing on a differential output of the first amplifier can be cancelled in the second amplifier. As a result, even when a noise component is superimposing on a power-supply line or ground line, signals can be correctly reproduced. Further, even when the differential output of the preamplifier includes an offset, signals can be correctly reproduced.

A twenty-sixth aspect of the present invention is directed to the optical receiver depending on the twenty-fifth aspect, characterized in that the center value generating part comprises:

a first peak detector detecting and storing a peak value of the positive-phase output of the first amplifier;

a second peak detector detecting and storing a peak value of the negative-phase output of the first amplifier; and a third amplifier amplifying a difference between an output of the first peak detector and an output of the second peak detector, and then differential-outputting the amplified result in the form of positive-phase output and negative-phase output, wherein the first center value is extracted from the positive-phase output of the third differential amplifier, and the second center value is extracted from the negative-phase output thereof.

As described in the foregoing, according to the twenty-sixth aspect, by using the first and second peak value detectors and the third amplifier, the first and second center values can be correctly generated with a simplified structure.

Moreover, the positive-phase output and the negative-phase output of the third are utilized as the first center value and the second center value. Therefore, even when a slight offset is respectively included in output voltages when the first amplifier and the second amplifier have no signal input, the offset components are balanced to each other in the third amplifier, thereby rendering an influence to be caused by the offset components smaller.

A twenty-seventh aspect of the present invention is directed to the optical receiver depending on the twenty-sixth aspect, characterized in that a value of positive-phase output and negative-phase output of the first amplifier receiving no signal input and a value of positive-phase output and negative-phase output of the third amplifier receiving no signal input are set to be equal.

As described in the foregoing, according to the twenty-seventh aspect, a value of the positive-phase output and the negative-phase output of the first amplifier receiving no signal input, a value of the positive-phase output and the negative-phase output of the third amplifier receiving no signal input, and the positive-phase output and the negative-phase output of the third amplifier are set equal. Therefore, offsets respectively occur in the first amplifier and the second amplifier can be almost perfectly cancelled in the second amplifier.

A twenty-eighth aspect of the present invention is directed to the optical receiver depending on the twenty-seventh aspect, characterized in that an amplification factor of the positive-phase output with respect to a differential input of the third amplifier and an amplification factor of the negative-phase output with respect to the differential input of the third amplifier are both set around 0.5.

As described in the foregoing, according to the twenty-eighth aspect, the positive-phase output level of the third amplifier can be set exactly equal to the center value of the positive-phase output of the first amplifier, and the negative-phase output level of the third differential amplifier can be set equal to the center value of the negative-phase output of the first differential amplifier. Therefore, the second amplifier can execute amplification in an accurate manner, whereby signals can be correctly reproduced.

A twenty-ninth aspect of the present invention is directed to the optical receiver depending on the twenty-eighth aspect, characterized in that the first amplifier at least comprises:

a first and second transistors whose sources are connected to each other;

a first current source which is connected to the connected-to-each-other sources of the first and second transistors;

a first resistor interposed between a drain of the first transistor and a power-supply line; and a second resistor interposed between a drain of the second transistor and a power-supply line, and the third amplifier at least comprising:

a third and fourth transistors;

a second current source;

a third resistor interposed between a source of the third transistor and the second current source;

a fourth resistor interposed between a source of the fourth transistor and the second current source;

a fifth resistor interposed between a drain of the third transistor and a power-supply line; and a sixth resistor interposed between a drain of the fourth transistor and a power-supply line, wherein when a product of a resistance value of the first resistor and a current value set in the first current source is P1, a product of a resistance value of the second resistor and a current value set in the first current source is P2, a product of a resistance value of the fifth resistor and a current value set in the second current source is P3, and a product of a resistance value of the sixth resistor and a current value set in the second current source is P4, resistance values of the first, second, fifth and sixth resistors and current values set in the first and second current sources are selected to satisfy an equation of $$P1=P2=P3=P4.$$

As described in the foregoing, according to twenty-ninth aspect, by equalizing products of the resistance values of resistors and the current values set in the current sources with one another, an output level of the first amplifier receiving no differential input and an output level when the third amplifier has no differential input can be equal.

A thirtieth aspect of the present invention is directed to the optical receiver depending on the twenty-ninth aspect, characterized in that resistance values of the first, second, fifth and sixth resistors are selected to be equal to one another, the resistance values of the third and fourth resistors are selected to be equal to each other, and the current value set in the first current source and the current value set in the second current source are selected to be equal to each other.

As described in the foregoing, according to the thirtieth aspect, as device constants are equalized, output variation of the first amplifier and output variation of the third amplifier resulted in varying temperature and varying power-supply voltage can be put to vary in a similar manner. Consequently, an amplifier having a resistance to environment can be provided.

A thirty-first aspect of the present invention is directed to the optical receiver depending on the twenty-sixth aspect, characterized in that circuit structures of the first and second peak detectors are identical to each other.

As described in the foregoing, according to the thirty-first aspect, the circuit structures of the first and second peak detectors are identical to each other. Therefore, by taking a difference of the outputs of these peak detecting circuits in the third amplifier, an error component of the outputs of these peak detecting circuits can be cancelled.

A thirty-second aspect of the present invention is directed to the optical receiver depending on the twenty-fifth aspect, characterized in that the center value generating part comprises:

a first low-pass filter passing only a low-frequency component of the positive-phase output of the first amplifier; and a second low-pass filter passing only a low-frequency component of the negative-phase output of the first amplifier.

As described in the foregoing, according to the thirty-second aspect, the first and second center values can be obtained with a simplified structure.

A thirty-third aspect of the present invention is directed to the optical receiver depending on the twenty-fifth aspect, characterized in that the second amplifier differential-outputs the amplified result in the form of positive-phase output and negative-phase output, and further comprises a comparator forming the result amplified by the second amplifier into a digital waveform by treating either the positive-phase output or the negative-phase output of the second amplifier as a threshold value to discriminate from the other.

As described in the foregoing, according to the thirty-third aspect, both phases (that is, the positive-phase output and the negative-phase output) of the bi-polarity signal outputted from the second amplifier are respectively provided as signal input and reference input of the comparator so as to perform pulse reproduction. With such structure, means for newly generating a reference signal becomes unnecessary, and a circuit can be accordingly downsized. Furthermore, a common-mode noise component superimposing on each phase output can be eliminated, and an influence to be caused by a noise component generating in the amplifier and superimposing on each phase output signal can be reduced. Therefore, a resistance to a noise can be improved.

BRIEF DESCRIPTION OF THE DRAWINGS

FIG. 14 is a block diagram showing the structure of an amplifying circuit according to a fifth embodiment of the present invention.

BEST MODE FOR CARRYING OUT THE INVENTION

First Embodiment

Figure 1:
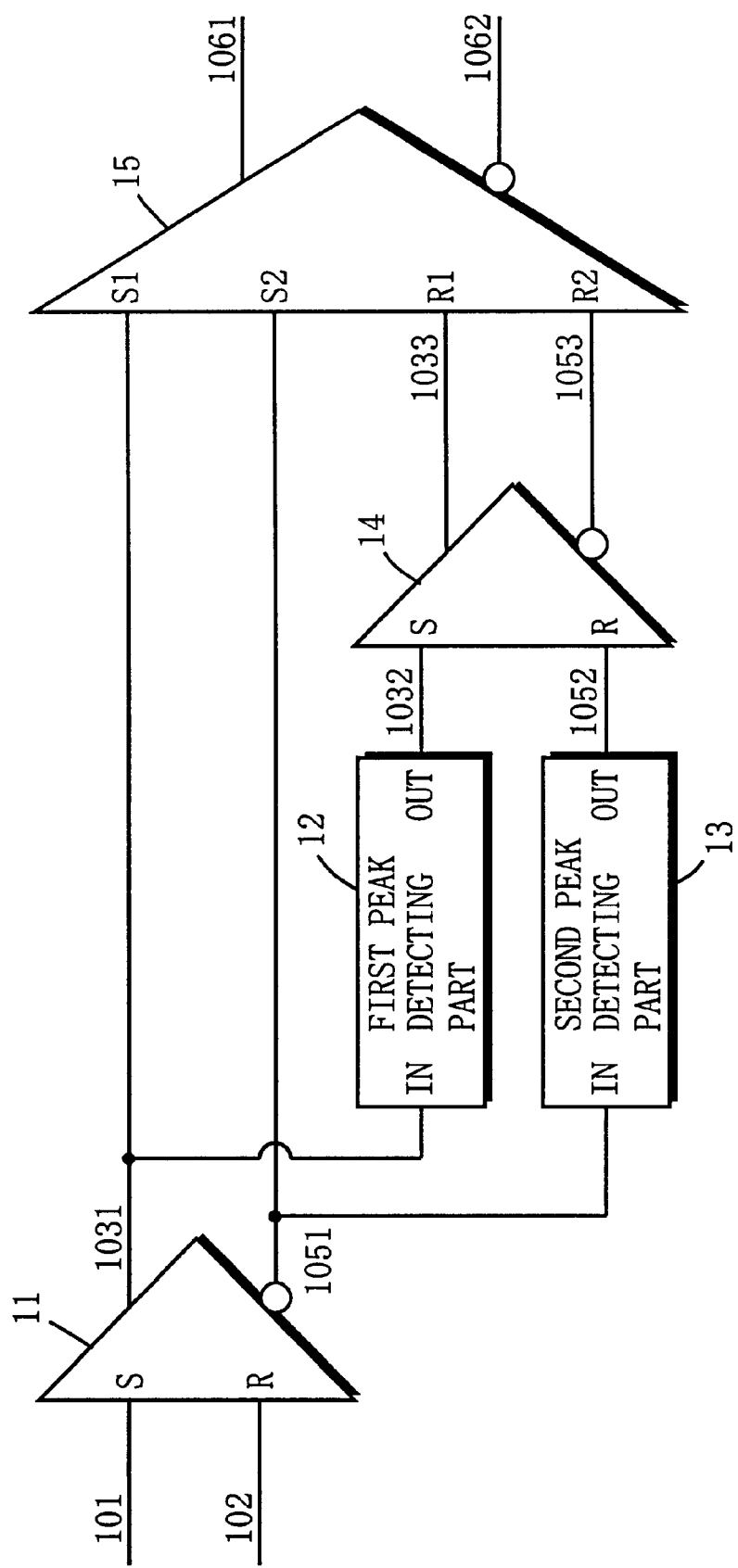
FIG. 1 is a block diagram showing the structure of an amplifying circuit according to a first embodiment of the present invention.

FIG. 1 is a block diagram showing the structure of an amplifying circuit according to a first embodiment of the present invention. In FIG. 1, the amplifying circuit of this embodiment includes a first differential amplifier 11, a first peak detecting part 12, a second peak detecting part 13, a second differential amplifier 14, and a combined differential amplifier 15.

A signal input terminal S provided in the first differential amplifier 11 receives a signal to be amplified, and a reference input terminal R provided in the differential amplifier 11 receives a reference signal. The first differential amplifier 11 amplifies a difference between a signal inputted into the signal input terminal S and a reference signal inputted into the reference input terminal R. The first differential amplifier 11 differential-outputs the amplified result to both positive-phase output and negative-phase output.

The first peak detecting part 12 inputs the positive-phase output of the first differential amplifier 11, then detects and stores a peak value thereof. The second peak detecting part 13 inputs the negative-phase output of the first differential amplifier 11, then detects and stores a peak value thereof. An output of the first peak detecting part 12 is provided to a signal input terminal S of the second differential amplifier 14, and an output of the second peak detecting part 13 is provided to a reference input terminal R of the second differential amplifier 14. The second differential amplifier 14 differential-outputs the amplified result to both positive-phase output and negative-phase output in a similar manner to the first differential amplifier 11. The positive-phase output of the second differential amplifier 14 is equal to a center value of the positive-phase output of the first differential amplifier 11, and the negative-phase output of the second differential amplifier 14 is equal to a center value of the negative-phase output of the first differential amplifier 11. To be specific, the first and second peak detecting parts 12 and 13, and the second differential amplifier 14 are constituting a center value generating part in which the center value of the positive-phase output of the first differential amplifier 11 and the center value of the negative-phase output thereof are generated.

The combined differential amplifier 15 is provided with a first and second signal input terminals S1 and S2, and a first and second reference input terminals R1 and R2. The first signal input terminal S1 receives the positive-phase output of the first differential amplifier 11, the second signal input terminal S2 receives the negative-phase output of the first differential amplifier 11, the first reference input terminal R1 receives the positive-phase output of the second differential amplifier 14, and the second reference input terminal R2 receives the negative-phase output of the second differential amplifier 14, respectively.

Herein, as to the combined differential amplifier 15, it is assumed that the first and second signal input terminals S1 and S2 respectively have an input voltage of $V_{S1}$ and $V_{S2}$, and the first and second reference input terminals R1 and R2 respectively have an input voltage of $V_{R1}$ and $V_{R2}$. When the combined differential amplifier 15 receives no signal input (that is, when both $(V_{S1}-V_{R1})$ and $(V_{S2}-V_{R2})$ are 0), a direct-current level of the positive-phase output and the negative-phase output is assumed to be $V_{OS15}$, and an amplification factor of the positive-phase output and the negative-phase output with respect to a differential input is assumed to be $A_{15}$. In this case, the positive-phase output $V_{out}$ and the negative-phase output $/V_{out}$ of the combined differential amplifier 15 respectively satisfy the following equations (1) and (2):

$$V_{out}=V_{OS15}+A_{15}*\{(V_{S1}-V_{R1})-(V_{S2}-V_{R2})\} \quad (1)$$

$$/V_{out}=V_{OS15}-A_{15}*\{(V_{S1}-V_{R1})-(V_{S2}-V_{R2})\} \quad (2)$$

Figure 2:
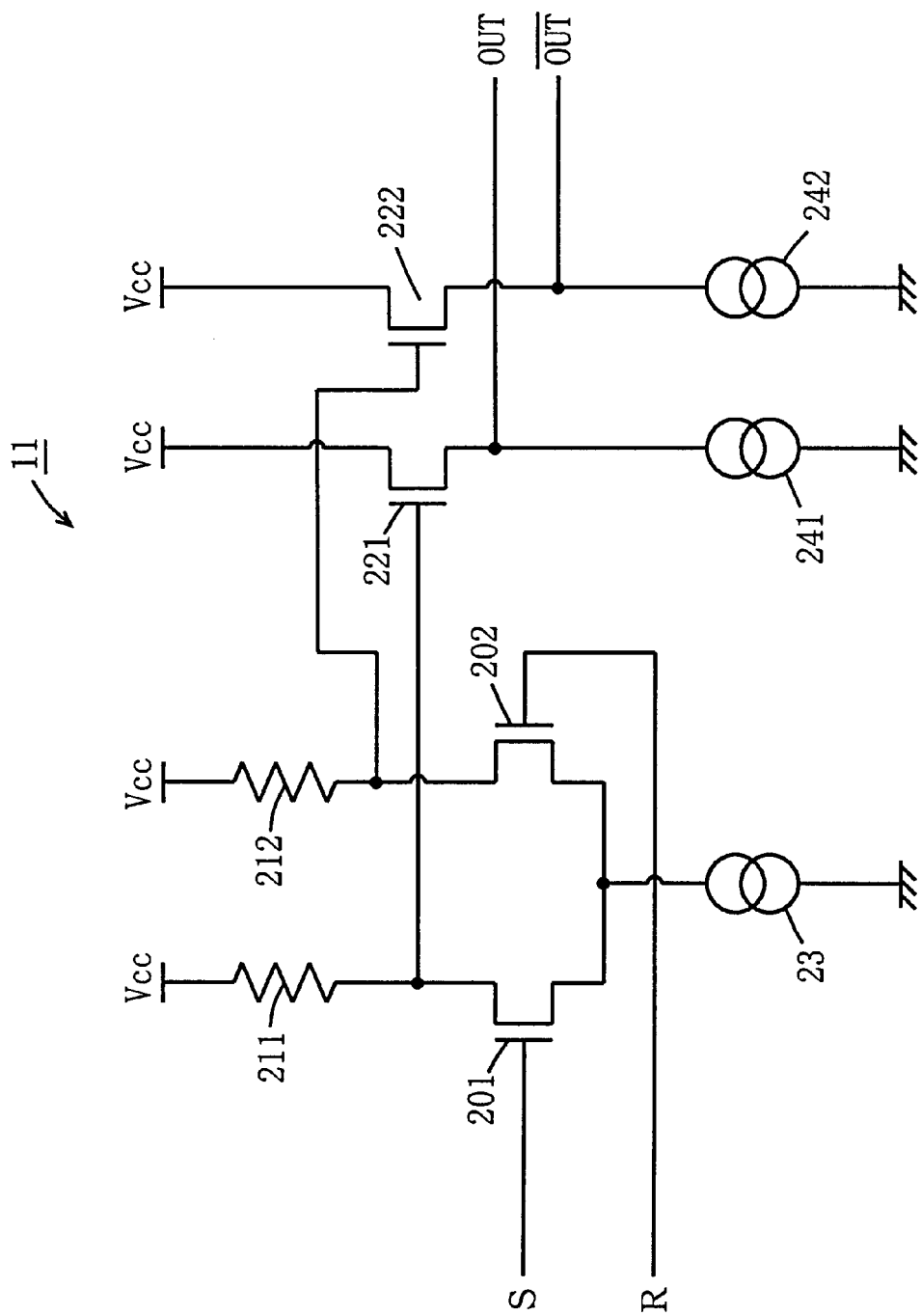
FIG. 2 is a schematic circuit diagram showing the exemplary detailed structure of a first differential amplifier 11 shown in FIG. 1.

FIG. 2 is a schematic circuit diagram showing the exemplary detailed structure of the first differential amplifier 11 shown in FIG. 1. In FIG. 2, the signal input terminal S and the reference input terminal R are respectively connected to gates of transistors 201 and 202. Each source of the transistors 201 and 202 is connected to a current source 23. Each drain of the transistors 201 and 202 is connected to a power-supply line through resistors 211 and 212. The drains of the transistors 201 and 202 are also connected to gates of transistors 221 and 222, respectively. Each drain of the transistors 221 and 222 is connected to a power-supply line. Each source of the transistors 221 and 222 is connected to current sources 241 and 242. The sources of the transistors 221 and 222 are also connected to a positive-phase output terminal and a negative-phase output terminal, respectively. Note that the resistors 211 and 212 are set equal in resistance value.

Figure 3:
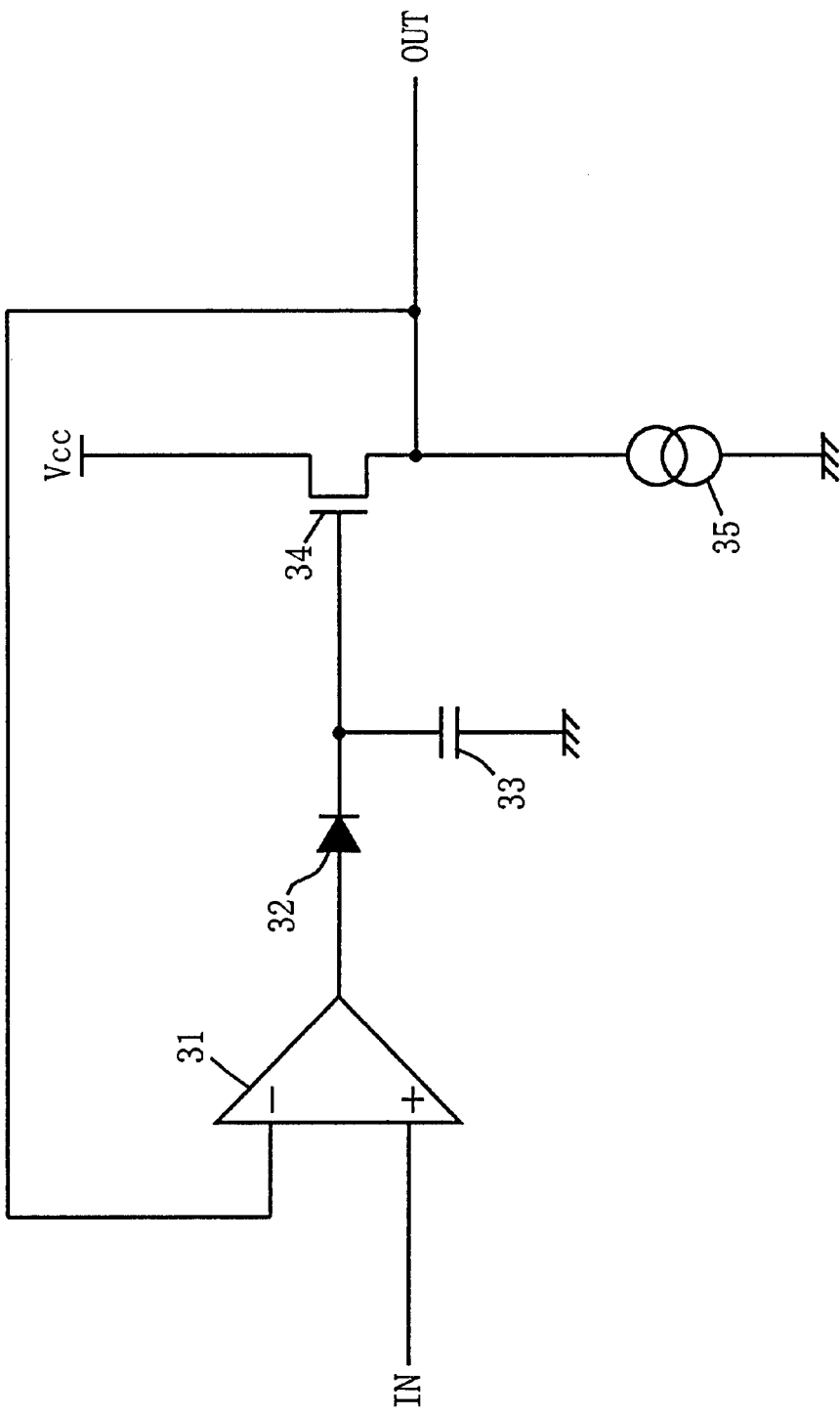
FIG. 3 is a schematic circuit diagram showing the exemplary detailed structure of a first peak detecting part 12 shown in FIG. 1.

FIG. 3 is a schematic circuit diagram showing the exemplary detailed structure of the first peak detecting part 12 shown in FIG. 1. In FIG. 3, an input terminal on "+" side of an operational amplifier 31 receives the positive-phase output of the first differential amplifier 11. An output of the operational amplifier 31 is provided to an anode of a diode 32. A cathode of the diode 32 is connected to both a peak-storing condenser 33 and a gate of a transistor 34. A drain of the transistor 34 is connected to a power-supply line. A source of the transistor 34 is connected to a current source 35. The source of the transistor 34 is also connected to an output terminal. A source output of the transistor 34 is fed back to an input terminal on "−" side of the operational amplifier 31. Note that a circuit structure of the second peak detecting part 13 is also exactly the same as the structure shown in FIG. 3.

Figure 4:
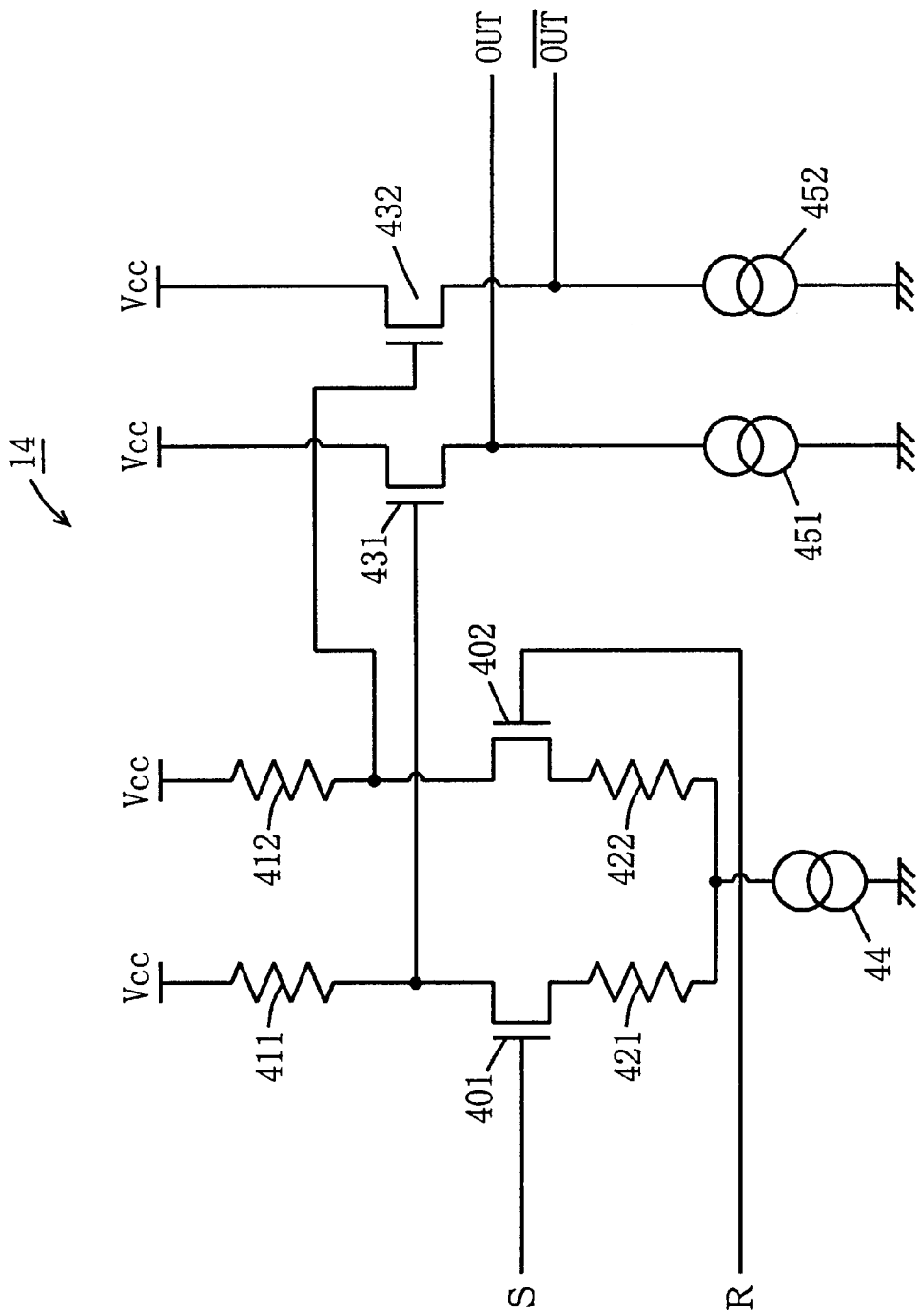
FIG. 4 is a schematic circuit diagram showing the exemplary detailed structure of a second differential amplifier 14 shown in FIG. 1.

FIG. 4 is a schematic circuit diagram showing the exemplary detailed structure of the second differential amplifier 14 shown in FIG. 1. In FIG. 4, the signal input terminal S and the reference input terminal R are respectively connected to gates of transistors 401 and 402. Sources of the transistors 401 and 402 are respectively connected to a current source 44 through resistors 421 and 422. Each drain of the transistors 401 and 402 is connected to a power-supply line through resistors 411 and 412. The drains of the transistors 401 and 402 are also connected to gates of transistors 431 and 432, respectively. Each drain of the transistors 431 and 432 is connected to a power-supply line. Sources of the transistors 431 and 432 are respectively connected to current sources 451 and 452. The sources of the transistors 431 and 432 are also connected to a positive-phase output terminal and a negative-phase output terminal, respectively. Note that the resistors 411 and 421 are set equal in resistance value, and the value is also equal to the resistance value of the resistors 211 and 212 in FIG. 2. Further, a current value of the current source 44 is set equal to the current value of the current source 23 in FIG. 2.

Figure 5:
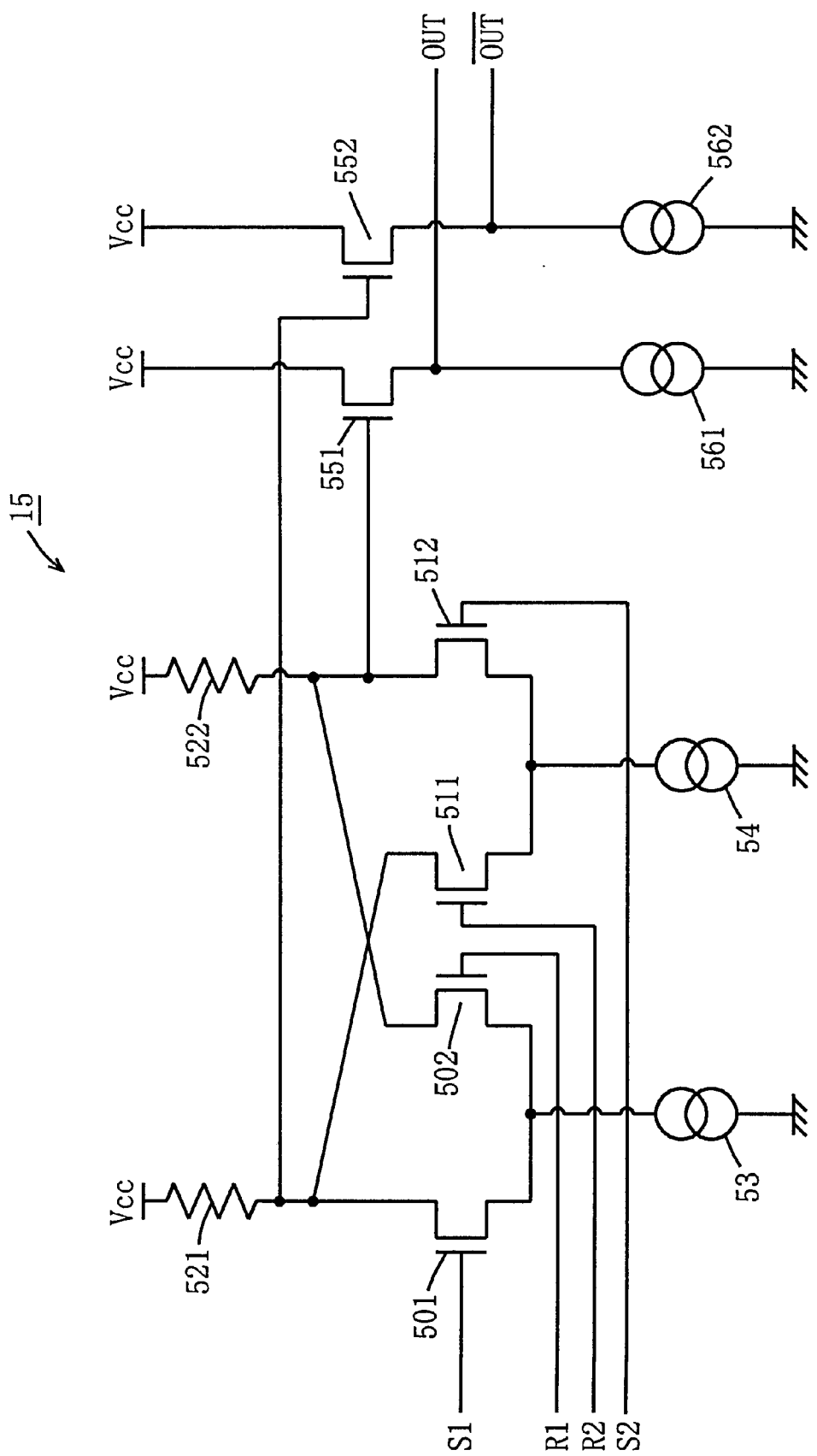
FIG. 5 is a schematic circuit diagram showing the exemplary detailed structure of a combined differential amplifier 15 shown in FIG. 1.

FIG. 5 is a schematic circuit diagram showing the exemplary detailed structure of the combined differential amplifier 15 shown in FIG. 1. In FIG. 5, the first signal input terminal S1 and the first reference input terminal R1 are respectively connected to gates of transistors 501 and 502. The second signal input terminal S2 and the second reference input terminal R2 are respectively connected to gates of transistors 512 and 511. Each source of the transistors 501 and 502 is connected to a current source 53. Each source of the transistors 511 and 512 is connected to a current source 54. Each drain of the transistors 501 and 512 is connected to a power-supply line through resistors 521 and 522. A drain of the transistor 502 is connected to the drain of the transistor 512. A drain of the transistor 511 is connected to the drain of the transistor 501. The drains of the transistors 501 and 512 are also connected to gates of transistors 552 and 551, respectively. Each drain of the transistors 551 and 552 is connected to a power-supply line. Sources of the transistors 551 and 552 are respectively connected to current sources 561 and 562. The sources of the transistors 551 and 552 are also connected to a positive-phase output terminal and a negative-phase output terminal, respectively.

In the combined differential amplifier 15 having the above-described structure, a current set in the current source 53 is divided and flows into the transistors 501 and 502 in accordance with a potential difference of an input signal to the first signal input terminal S1 and an input signal to the first reference input terminal R1. Moreover, a current set in the current source 54 is divided and flows into the transistors 511 and 512 in accordance with a potential difference an input signal to the second signal input terminal S2 and an input signal to the second reference input terminal R2. The current divided and flows into the respective pairs of transistors flow to the resistors 521 and 522, whereby an inputted current signal is converted into a voltage signal and outputted. Furthermore, the interconnected drains of the transistors 501 and 511 combine the currents, and the interconnected drains of the transistors 502 and 512 combine the currents, whereby the positive-phase output and the negative-phase output of the combined differential amplifier 15 can be represented by the aforementioned equations (1) and (2). As will be known from the above, the combined differential amplifier 15 is provided with two differential amplifiers and is configured to combine outputs of these two differential amplifiers in an output stage.

Figure 6A:
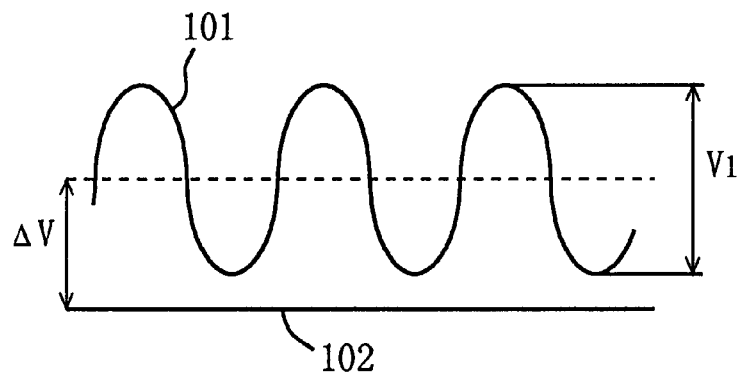
FIGS. 6a, 6b, 6c show waveform diagrams of a signal in the respective parts of the amplifying circuit shown in FIG. 1.
Figure 6B:
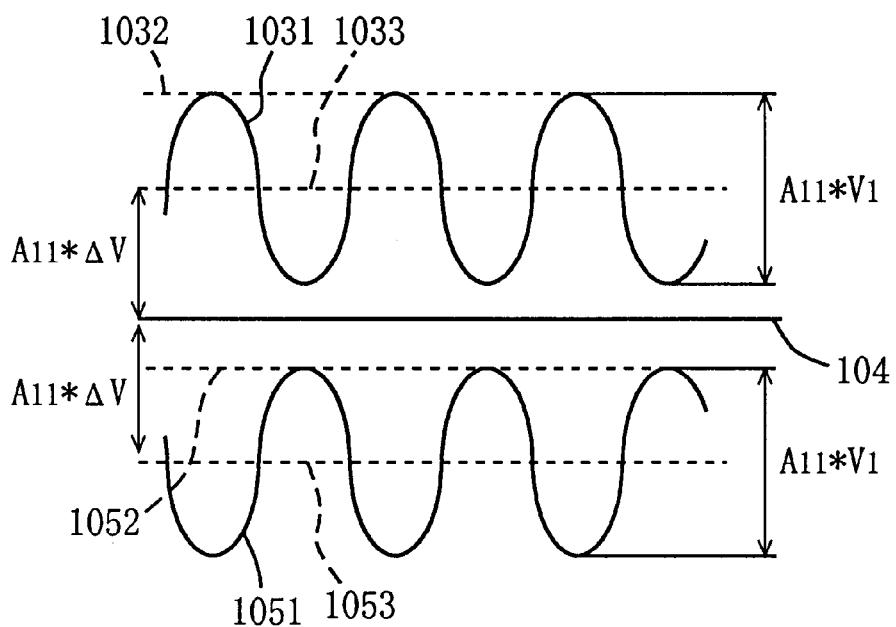
Figure 6C:
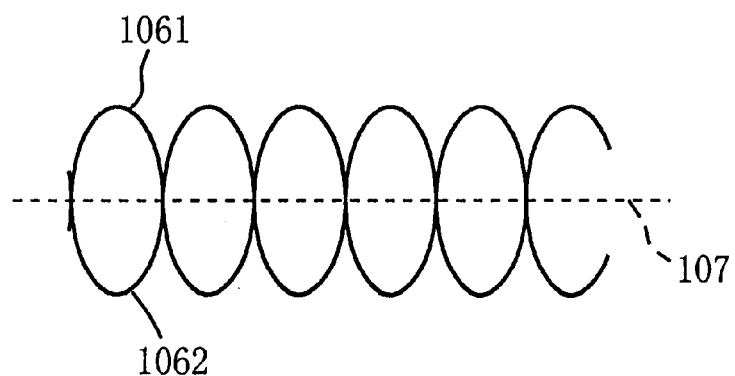

FIGS. 6a, 6b, 6c show waveforms of a signal in the respective parts of the amplifying circuit shown in FIG. 1. In FIG. 6(a), a waveform 101 denotes a signal input waveform of the first differential amplifier 11, and a waveform 102 denotes a reference input waveform of the first differential amplifier 11, respectively. In FIG. 6(b), a waveform 104 denotes a level of the positive-phase output and the negative-phase output of the first differential amplifier 11 receiving no signal input, a waveform 1031 denotes a waveform of the positive-phase output of the first differential amplifier 11 receiving a signal input, a waveform 1051 denotes a waveform of the negative-phase output of the first differential amplifier 11 receiving a signal input, a waveform 1032 denotes an output waveform of the first peak detecting part 12, a waveform 1052 denotes an output waveform of the second peak detecting part 13, a waveform 1033 denotes a waveform of the positive-phase output of the second differential amplifier 14, and a waveform 1053 denotes a waveform of the negative-phase output of the second differential amplifier 14, respectively. Note in FIG. 6(b) that. ΔV denotes an error of an average level of the signal input waveform 101 and the reference input waveform 102, $A_{11}$ denotes an amplification factor of the differential amplifier 11, and $V_1$ denotes an amplitude of the signal input waveform 101. In FIG. 6(c), a waveform 107 denotes a level of the positive-phase output and the negative-phase output of the combined differential amplifier 15 receiving no signal input (that is, when both $(V_{S1}-V_{R1})$ and $(V_{S2}-V_{R2})$ are 0), a waveform 1061 denotes a waveform of the positive-phase output of the combined differential amplifier 15 receiving a signal input, and a waveform 1062 denotes a waveform of the negative-phase output of the combined differential amplifier 15 receiving a signal input, respectively.

Referring to FIGS. 6a, 6b, 6c an operation of the amplifying circuit according to the first embodiment is described next below.

When a voltage level of power-supply line is Vcc, a resistance value being equal to both the resistor 211 and 212 is R1, a voltage between the gate and source of the transistor 221 or that of the transistor 222 is $V_{GS1}$, and a current value set in the current source 23 is $I_{23}$, a level $V_{OS11}$ of the positive-phase output and the negative-phase output of the first differential amplifier 11 receiving no signal input (that is, when signal input and reference input are equal) is represented by the following equation (3):

$$V_{OS11} = Vcc - (R1*I_{23}/2) - V_{GS1} \qquad (3)$$

When each resistance value of the resistors 411 and 412 is R1 (as is set equal to the resistance value of the resistors 211 and 212), a current value set in the current source 44 is $I_{23}$ (as is set equal to the current value set in the current source 23), and a voltage between the gate and source of the transistor 431 or that of the transistor 432 is $V_{GS2}$, an output level $V_{OS14}$ of the positive-phase output and the negative-phase output of the second differential amplifier 14 receiving no signal input (that is, when signal input and reference input are equal) is represented by the following equation (4):

$$V_{OS14} = Vcc - (R_1*I_{23}/2) - V_{GS2} \qquad (4)$$

Herein, the aforementioned equations (3) and (4) show that $V_{OS11}$ and $V_{OS14}$ can be set equal when current values of the current sources 241, 242, 451 and 452 are set equal to one another, and when gate lengths and gate widths of the transistors 221, 222, 431 and 432 are set equal to one another. This is because, in this case, the voltage $V_{GS1}$ between the gate and source of the transistor 221 or that of the transistor 222 becomes equal to the voltage $V_{GS2}$ between the gate and source of the transistor 431 or that of the transistor 432. Further, the equations also show that $V_{OS11}$ and $V_{OS14}$ are always of equal value if the current sources 241, 242, 451 and 452 have such configurations that current values set therein vary in a similar manner to one another regardless of varying power-supply voltage or varying operating temperature.

When the resistance value of the resistors 411 and 412 is R1, a resistance value of the resistors 421 and 422 is R2, and a transconductance of the transistors 401 and 402 is gml, an amplification factor $A_{14}$ being a ratio of a differential output with respect to a differential input of the second differential amplifier 14 is represented by the following equation (5):

$$A_{14} = R1/\{R2 + (1/gml)\} \qquad (5)$$

The amplification factor $A_{14}$ can be set in a value close to 1 if the transistors 401 and 402 have such configurations that the transconductance gml becomes sufficiently large, and if the resistance values R1 and R2 are selected to be of the almost same value.

In this example, in the second differential amplifier 14, an amplification factor being a ratio of the positive-phase output to the differential input and an amplification factor being a ratio of the negative-phase output with respect to the differential input are both 0.5. Moreover, as these amplification factors are determined only with the resistance values R1 and R2, the amplification factor of 0.5 is not affected by varying power-supply voltage or varying operating temperature but remains stable.

When the signal input terminal S of the first differential amplifier 11 receives a signal denoted by the waveform 101, and when the reference input terminal R thereof receives a signal denoted by the waveform 102, signal waveforms of the positive-phase output and the negative-phase output of the first differential amplifier 11 are the ones shown by the waveforms 1031 and 1051, respectively. When an amplitude of the signal waveform 101 is $V_1$, a potential difference between the signal waveform 102 and an average value of the signal waveform 101 is $\Delta V$, an output voltage of the positive-phase output and the negative-phase output of the first differential amplifier 11 there is no signal input is $V_{OS11}$, and an amplification factor being a ratio of the positive-phase output with respect to the differential input of the first differential amplifier 11 or the negative-phase output thereto is $A_{11}$, outputs $V_{max12}$ and $V_{max\,13}$ of the first and second peak detecting parts 12 and 13 are respectively represented by the following equations (6) and (7):

$$V_{max12} = V_{OS11} + (A_{11}*\Delta V) + (A_{11}*V_1/2) \qquad (6)$$

$$V_{max13} = V_{OS11} - (A_{11}*\Delta V) + (A_{11}*V_1/2) \qquad (7)$$

Next, a potential level $V_{out14}$ of the positive-phase output and a potential level $/V_{out14}$ of the negative-phase output of the second differential amplifier 14 are respectively represented by the following equations, (8) and (9). These equations apply the amplification factor of 0.5 being the ratio of the positive-phase output with respect to the differential input of the second differential amplifier 14 or the negative-phase output thereto, and the aforementioned output voltage level of $V_{OS11}$ being the level of the positive-phase output and the negative-phase output when there is no signal input.

$$V_{out14} = V_{OS11} + \{0.5*(V_{max12} - V_{max13})\} = V_{OS11} + (A_{11}*\Delta V) \qquad (8)$$

$$/V_{out14} = V_{OS11} - \{0.5*(V_{max12} - V_{max13})\} = V_{OS11} - (A_{11}*\Delta V) \qquad (9)$$

The voltage level of the signal waveform 1033 which is the positive-phase output of the second differential amplifier 14 is $V_{out14}$, and this value coincides with an average value level of the signal waveform 1031 of the positive-phase output of the differential amplifier 11.

Further, the voltage level of the signal waveform 1053 which is the negative-phase output of the second differential amplifier 14 is $/V_{out14}$, and this value coincides with an average value level of the signal waveform 1051 of the negative-phase output of the differential amplifier 11.

In the combined differential amplifier 15, the first signal input terminal S1 receives the positive-phase output of the first differential amplifier 11 denoted by the signal waveform 1031, and the first reference input terminal R1 receives the positive-phase output of the second differential amplifier 14 denoted by the signal waveform 1033. Moreover, the second signal input terminal S2 receives the negative-phase output of the first differential amplifier 11 denoted by the signal waveform 1051, and the second reference input terminal R2 receives the negative-phase output of the second differential amplifier 14 denoted by the signal waveform 1053.

When an amplification factor of the combined differential amplifier 15 is $A_{15}$, and a voltage level of the positive-phase output and the negative-phase output when there is no signal input is $V_{OS15}$, as a positive-phase output of the combined differential amplifier 15, $$V_{OS15} + A_{15}*\{(V_{S1} - V_{R1}) + (V_{R2} - V_{S2})\}$$

an output is obtained represented by the aforementioned equation, and as a negative-phase output thereof, $$V_{OS15} - A_{15}*\{(V_{S1} - V_{R1}) + (V_{R2} - V_{S2})\}$$

an output is obtained represented by the aforementioned equation. As will be known from the foregoing, the positive-phase output of the combined differential amplifier 15 is denoted by the waveform 1061 in which an amplitude thereof is defined as $A_{15}* (A_{11}* V_1)$, and an average value thereof is defined as $V_{OS15}$. Further, the negative-phase output of the combined differential amplifier 15 is, in a similar manner to the positive-phase output thereof, denoted by the waveform 1062 in which an amplitude thereof is defined as $A_{15}*(A_{11}*V_1)$, and an average value thereof is defined as $V_{OS15}$, and a phase thereof is denoted by the signal waveform 1062 which is shifted 180-degree from that of the positive-phase output. By inputting these positive-phase output and the negative-phase output into a comparator (not shown), an output which precisely indicates a logical level of "1" or "0" can be obtained.

Hereinafter, it is considered a case where an offset occurs at output voltage level of the positive-phase output and the negative-phase output when the first and second differential amplifiers 11 and 14 have no signal input. Such offset occurs when resistance values of the resistance devices provided in the first and second differential amplifiers 11 and 14 are varying, or when current values set in the current sources are varying.

Herein, an offset voltage is assumed to be $\Delta V_1$. If an output of the first differential amplifier 11 receiving no signal input is assumed to be $V_{OS11}$, an output level of the second differential amplifier 14 receiving no signal input is represented by the following equation:

$$V_{OS11}+\Delta V_1$$

In this case, the positive-phase output $V_{out14}$ of the second differential amplifier 14 and the negative-phase output/$V_{out14}$ thereof are respectively represented by the following equations (10) and (11). Note in the following equations (10) and (11) that $A_{11}$ denotes an amplification factor of the first differential amplifier 11, and $\Delta V$ denotes a difference between an average voltage level of signal input of the first differential amplifier 11 and a voltage level of reference input thereof.

$$V_{out14}=V_{OS11}+\Delta_1+A_{11}*\Delta V \quad (10)$$

$$/V_{out14}=V_{OS11}+\Delta_1-A_{11}*\Delta V \quad (11)$$

The positive-phase output $V_{out15}$ of the combined differential amplifier 15 and the negative-phase output/$V_{out15}$ thereof are respectively represented by the following equations (12) and (13).

$$V_{out15}=V_{OS15}+A_{15}*(V_{S1}-V_{out14}-V_{S2}+/V_{out14}) \quad (12)$$

$$/V_{out15}=V_{OS15}-A_{15}*(V_{S1}-V_{out14}-V_{S2}+/V_{out14}) \quad (13)$$

When the foregoing equations (10) and (11) are substituted in these equations (12) and (13), the terms of $V_{OS11}$ and $\Delta V_1$ are eliminated. It means, even in a case where offsets occur at output voltage level of the first and second differential amplifiers 11 and 14 receiving no signal input, the offset voltage components thereof are cancelled in the combined differential amplifier 15, whereby a signal component can be correctly amplified.

Note that, by equalizing constants of devices in the first and second differential amplifiers 11 and 14 (in other words, by equalizing resistance values of the resistors 211, 212, 411 and 412, resistance values of the resistors 421 and 422, and current values set in the current sources 23 and 44, respectively), output variation of the first differential amplifier 11 and output variation of the second amplifier 14 to be caused by varying temperature or varying power-supply voltage can be put to vary in a similar manner to each other. As a result, a resistance to environment can be obtained.

If the aforementioned resistance to environment is not desired, the device constants are not necessarily equalized. As to the device constants, however, resistance values of the resistors 211, 212, 411 and 412 and current values set in the current sources 23 and 44 should be of such values that an equation of:

P1=P2=P3=P4 is satisfied, where a product of a resistance value of the resistor 211 and a current value set in the current source 23 is P1, a product of a resistance value of the resistor 212 and a current value set in the current source 23 is P2, a product of a resistance value of the resistor 411 and a current value set in the current source 44 is P3, and a product of a resistance value of the resistor 412 and a current value set in the current source 44 is P4.

Second Embodiment

Figure 7:
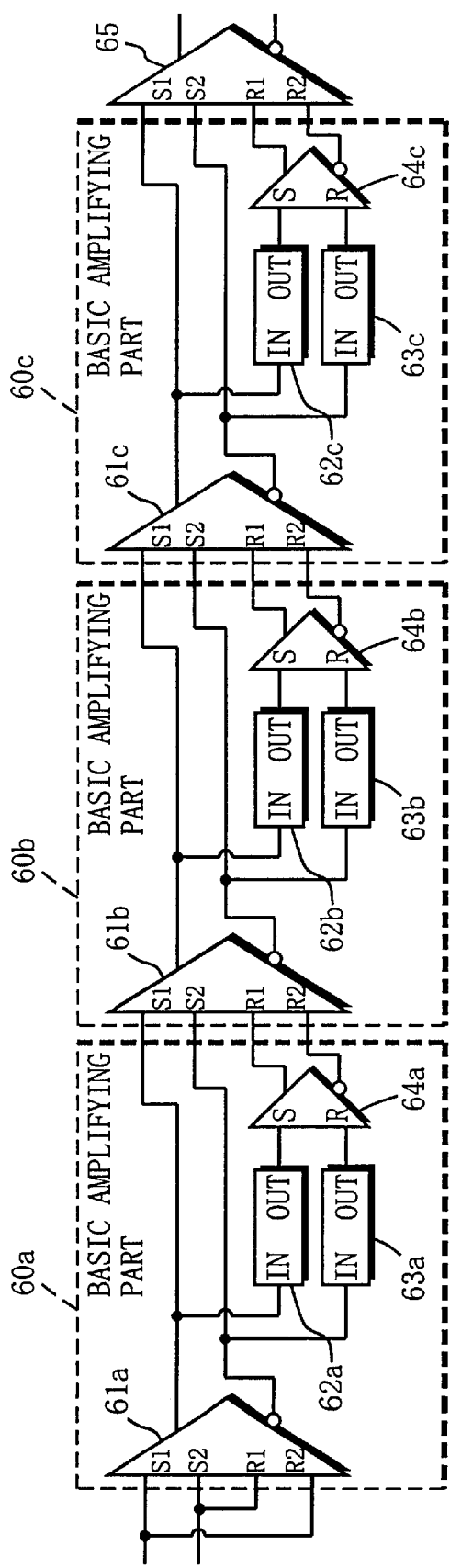
FIG. 7 is a block diagram showing the structure of an amplifying circuit according to a second embodiment of the present invention.

FIG. 7 is a block diagram showing the structure of an amplifying circuit according to a second embodiment of the present invention. The amplifying circuit of the second embodiment has a structure in which a plurality of basic amplifying parts each having an identically-structured circuit are cascade-connected. FIG. 7 shows an exemplary structure in which three basic amplifying parts 60a to, 60c are cascade-connected. Herein, a combined differential amplifier 65 is connected to the last basic amplifying part 60c.

In FIG. 7, the first basic amplifying part 60a includes a combined differential amplifier 61a, a first peak detecting part 62a, a second peak detecting part 63a, and a differential amplifier 64a. The combined differential amplifier 61a is provided with a first and second signal input terminals S1 and S2, and a first and second reference input terminals R1 and R2. The first signal input terminal S1 and the second reference input terminal R2 receive signals to be amplified, and the second signal input terminal S2 and the first reference input terminal R1 receive reference signals. The first peak detecting part 62a receives a positive-phase output of the combined differential amplifier 61a, then detects and stores a peak value thereof. The second peak detecting part 63a receives a negative-phase output of the combined differential amplifier 61a, then detects and stores a peak value thereof. In the differential amplifier 64a, a signal input terminal S receives an output of the first peak detecting part 62a, and a reference input terminal R receives an output of the second peak detecting part 63a, then the differential amplifier 64a differential-amplifies the outputs.

The second basic amplifying part 60b includes a combined differential amplifier 61b, a first peak detecting part 62b, a second peak detecting part 63b, and a differential amplifier 64b. In the combined differential amplifier 61b, a first signal input terminal S1 receives the positive-phase output of the preceding combined differential amplifier 61a, a second signal input terminal S2 receives the negative-phase output of the preceding combined differential amplifier 61a, a first reference input terminal R1 receives the positive-phase output of the preceding differential amplifier 64a, and a second reference input terminal R2 receives the negative-phase output of the preceding differential amplifier 64a. The first peak detecting part 62b receives a positive-phase output of the combined differential amplifier 61b, then detects and stores a peak value thereof. The second peak detecting part 63b receives a negative-phase output of the combined differential amplifier 61b, then detects and stores a peak value thereof. In the differential amplifier 64b, a signal input terminal S receives an output of the first peak detecting part 62b, and a reference input terminal R receives an output of the second peak detecting part 63b, then the differential amplifier 64b differential-amplifies the outputs.

The third basic amplifying part 60c includes a combined differential amplifier 61c, a first peak detecting part 62c, a second peak detecting part 63c, and a differential amplifier 64c. In the combined differential amplifier 61c, a first signal input terminal S1 receives the positive-phase output of the preceding combined differential amplifier 61b, a second signal input terminal S2 receives the negative-phase output of the preceding differential amplifier 61b, a first reference input terminal R1 receives the positive-phase output of the preceding differential amplifier 64b, and a second reference input terminal R2 receives the negative-phase output of the preceding differential amplifier 64b. The first peak detecting part 62c receives a positive-phase output of the combined differential amplifier 61c, then detects and stores a peak value thereof. The second peak detecting part 63c receives a negative-phase output of the combined differential amplifier 61c, then detects and stores a peak value thereof. In the differential amplifier 64c, a signal input terminal S receives an output of the first peak detecting part 62c, and a reference input terminal R receives an output of the second peak detecting part 63c, then the differential amplifier 64c differential-amplifies the outputs.

A differential amplifier 65 is provided with a first and second signal input terminals S1 and S2, and a first and second reference input terminals R1 and R2. The first signal input terminal S1 receives the positive-phase output of the preceding combined differential amplifier 61c, the second signal input terminal S2 receives the negative-phase output of the preceding combined differential amplifier 61c, the first reference input terminal R1 receives the positive-phase output of the preceding differential amplifier 64c, and the second reference input terminal R2 receives the negative-phase output of the preceding differential amplifier 64c.

In this example, circuit structures of the combined differential amplifiers 61a to 61c and 65 are identical to one another as the circuit structure shown in FIG. 5, for example. Circuit structures of the first peak detecting circuits 62a to 62c and the second peak detecting circuits 63a to 63c are identical to one another as the circuit structure shown in FIG. 3, for example. Also, circuit structures of the differential amplifiers 64a to 64c are identical to one another as the circuit structure shown in FIG. 4, for example. Accordingly, the following description is made on assumption that the circuit structures of the combined differential amplifiers 61a to 61c and 65 are similar to that of FIG. 5, the circuit structures of the first peak detecting circuits 62a to 62c and the second peak detecting circuits 63a to 63c are similar to that of FIG. 3, and the circuit structures of the differential amplifier 64a to 64c are similar to that of FIG. 4.

Herein, device constants in the respective circuits shown in FIG. 7 may be set in a similar manner to the corresponding devices in the first embodiment described with reference to FIGS. 3 to 5. Further, resistance values of the resistors 411 and 412 in FIG. 4 are set equal to resistance values of the resistors 521 and 522 in FIG. 5. In this example, the resistance value is assumed to be R3. Also, a current value set in the current source 44 is set equal to a sum of current values set in the current source 53 and the current source 54. When a current value set in the current source 44 is $I_{44}$, current value set in the current sources 53 and 54 will be $0.5*I_{44}$, each current values set in the current sources 53 and 54 will be $0.5*I_{44}$.

In the combined differential amplifier 61a having the same circuit structure as that of FIG. 5, receiving no differential input, the following equations can be satisfied among voltages $V_{S1}$ and $V_{S2}$ of the first and second signal input terminals S1 and S2 and voltages $V_{R1}$ and $V_{R2}$ of the first and second reference input terminals R1 and R2.

$V_{S1}=V_{R1}$ $V_{S2}=V_{R2}$

Therefore, a current flowing to the current sources 53 is equally divided and flows into the transistors 501 and 502, and a current flowing to the current source 54 is equally divided and flows into the transistors 511 and 512. In this manner, the resistors 521 and 522 respectively have a current of $0.5*I_{44}$. Assuming that each resistance value of the resistors 521 and 522 is R3, a voltage between the gate and source of the transistor 551 or that of the transistor 552 is $V_{gs3}$, and a power-supply voltage is Vcc, a voltage level $V_{OS67}$ of the positive-phase output and the negative-phase output of the combined differential amplifier 61a receiving no signal input can be represented by the following equation (14):

$$V_{OS61}=Vcc-(0.5*I_{44}*R3)-V_{gs3} \quad (14)$$

Next, an output voltage $V_{OS64}$ of the differential amplifier 64a having the same circuit structures as in FIG. 4 which is receiving no signal input is described. With no differential input, a current flowing to the current source 44 is equally divided and flows into the resistors 411 and 412. In this manner, when each resistance value of the resistors 411 and 412 is assumed to be R3, and a voltage between the gate and source of the transistor 431 or that of the transistor 432 is assumed to be $V_{gs4}$, an output voltage $V_{OS64}$ of the differential amplifier 64a receiving no signal input can be represented by the following equation (15):

$$V_{OS64}=Vcc-(0.5*I_{44}*R3)-V_{gs4} \quad (15)$$

$V_{gs3}$ and $V_{gs4}$ can be equalized if current values set in the current sources 451, 452, 561 and 562 are equalized and gate lengths and gate widths of the transistors 431, 432, 551 and 552 are equalized. In this manner, $V_{OS61}$ and $V_{OS64}$ are of an equal value.

In this example, an output level of the combined differential amplifier 61a receiving no signal input and an output level of the differential amplifier 64a receiving no signal input are set equal, and an amplification factor being a ratio of the positive-phase output with respect to a differential input of the differential amplifier 64a and the negative-phase output thereto is each set to be 0.5. Therefore, in a similar manner to the first embodiment, the positive-phase output of the differential amplifier 64a becomes equal to an average value level of the positive-phase output of the combined differential amplifier 61a, and the negative-phase output of the differential amplifier 64a becomes equal to an average value level of the negative-phase output of the combined differential amplifier 61a. That is, the first and second peak detecting parts 62a and 63a, and the differential amplifier 64a constitute a center value generating part in which a center value of the positive-phase output of the combined differential amplifier 61a and a center value of the negative-phase output thereof are generated. Consequently, the combined differential amplifier 61b in the following stage amplifies signals in an accurate manner.

The aforementioned operation is also executed between the second basic amplifying part 60b and the third basic amplifying part 60c, and between the third basic amplifying part 60c and the combined differential amplifier 65.

It should be noted that the aforementioned operation is designed with an ideal environment having no error. As there is no practical circuit having no error, it is required to consider an influence to be caused by a possible error.

When an input offset voltage which is a voltage level difference between a reference voltage and an average value of signals inputted into the first basic amplifying part 60a is $\Delta V$, an amplification factor of the combined differential amplifier 61a is A, and a deviation from the amplification factor of 0.5 of the differential amplifier 64a is A', a level difference between a reference input voltage and an average voltage level of signals inputted into the combined differential amplifier 61b provided in the basic amplifying part 60b in the following stage is as follows:

$$2*A*A'*\Delta V$$

When an amplitude of the input signal is assumed to be V, an amplitude of an output of the combined differential amplifier 61b is A*V. Thus, a ratio α of the output to the input is as follows:

$$\alpha=2*A*A'*\Delta V/A*V=2*A'*\Delta V/V$$

The ratio α represents an error per stage.

When the basic amplifying parts are connected in N stages, a ratio αn at this time is as follows on assumption that an offset of $\Delta V$ is applied to an input in each stage.

$$\alpha n=\{(2*A')^2+(1/A)^2\}^{n/2}*\Delta V/V$$

This equation shows that an offset voltage after the N stages being connected can be sufficiently lowered by sufficiently reducing the deviation A' from the amplification factor of 0.5 of the differential amplifiers 64a, 64b and 64c. Accordingly, amplification in a correct manner can be achieved.

Third Embodiment

Figure 8:
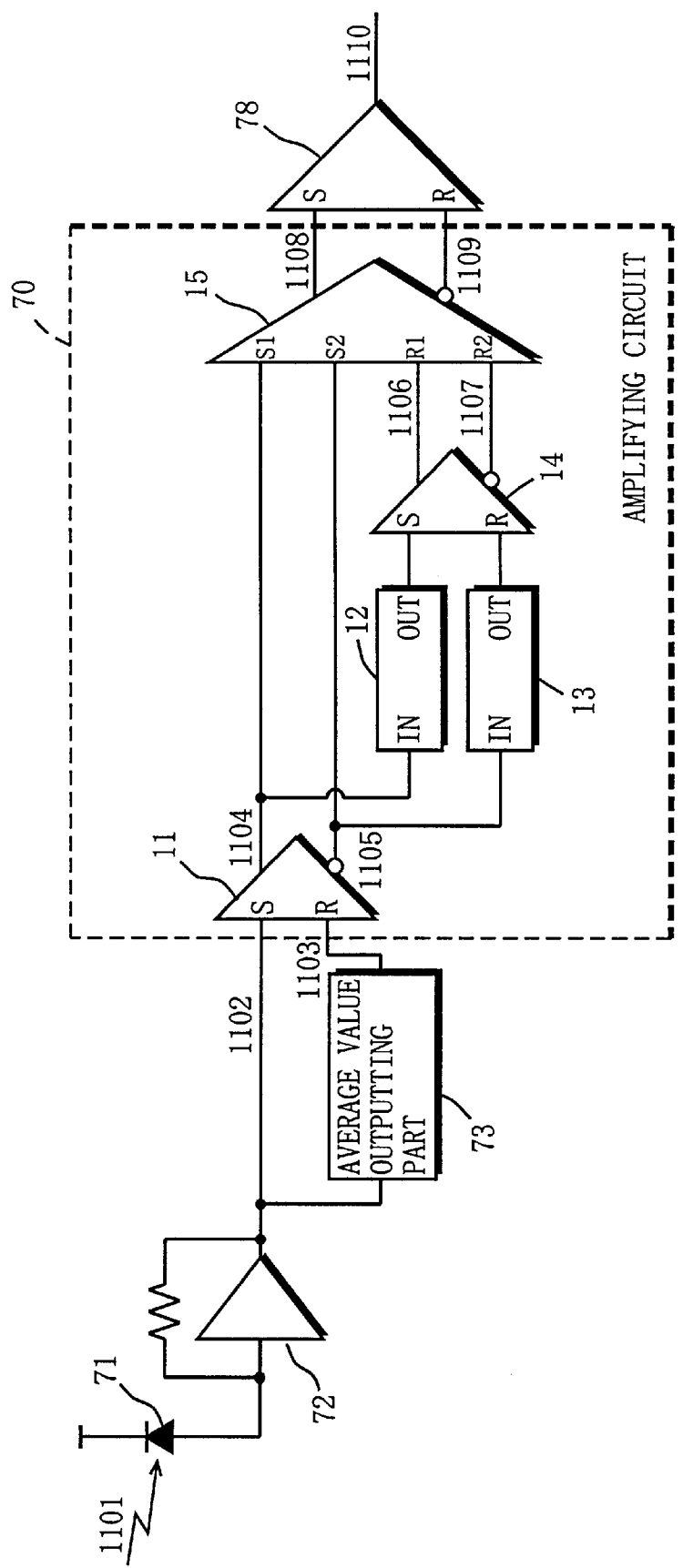
FIG. 8 is a block diagram showing the structure of an optical receiver according to a third embodiment of the present invention.

FIG. 8 is a block diagram showing the structure of an optical receiver according to a third embodiment of the present invention. In FIG. 8, the optical receiver of this embodiment is constituted by an amplifying circuit 70 having the same circuit structure as the amplifying circuit described in the first embodiment (refer to FIG. 1). The optical receiver of this embodiment further includes an optical-to-electrical conversion device 71, a preamplifier 72, an average value outputting part 73, and a comparator 78.

The optical-to-electrical conversion device 71 converts an optical signal to be inputted into a current signal. The preamplifier 72 converts the current signal outputted from the optical-to-electrical conversion device 71 into a voltage signal. The average value outputting part 73 outputs a voltage level being more or less in the middle of an amplitude of an output signal of the preamplifier 72.

The amplifying circuit 70 has a structure similar to the amplifying circuit shown in FIG. 1, and includes the first differential amplifier 11, the first peak detecting part 12, the second peak detecting part 13, the second differential amplifier 14, and the combined differential amplifier 15.

In the first differential amplifier 11, the signal input terminal S receives an output of the preamplifier 72, and the reference input terminal R receives an output of the average value outputting part 73. A circuit structure of the first differential amplifier 11 is found in FIG. 2. Circuit structures of the first and second peak detecting parts 12 and 13 are identical to each other, and the circuit structure is found in FIG. 3. An amplification factor of the second differential amplifier 14 is set to be 0.5 as is the differential amplifier shown in FIG. 1, and an output voltage level thereof receiving no differential input is set equal to an output voltage level of the first differential amplifier receiving no signal input. A circuit structure of the second differential amplifier 14 is found in FIG. 4. A circuit structure of the combined differential amplifier 15 is found in FIG. 5.

In the comparator 78, the signal input terminal S receives a positive-phase output of the combined differential amplifier 15, and the reference input terminal R receives a negative-phase output of the combined differential amplifier 15.

Figure 9:
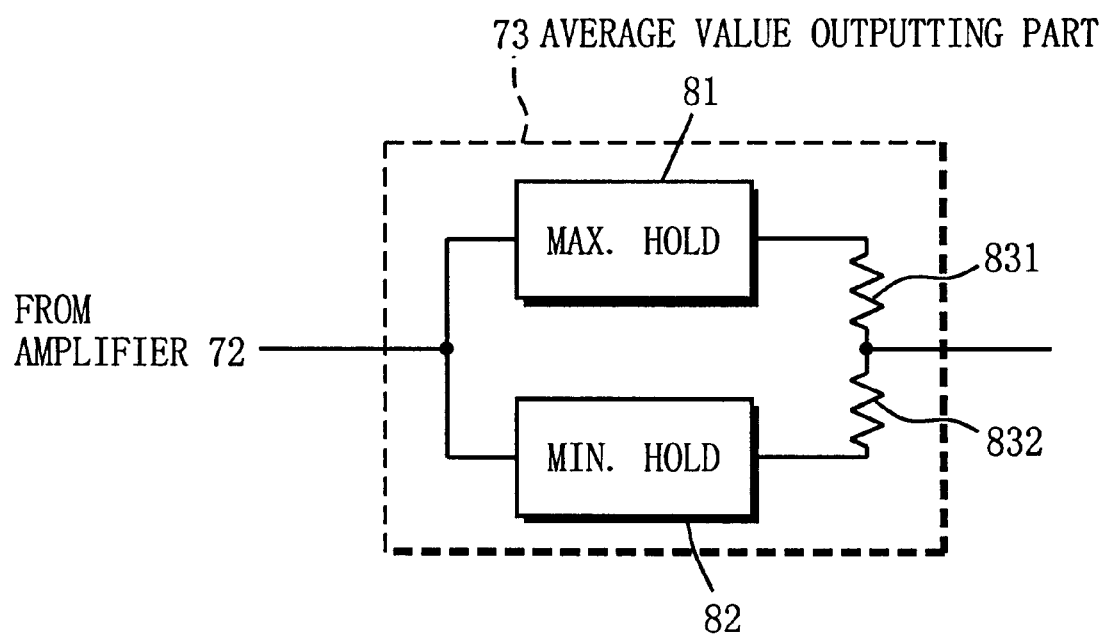
FIG. 9 is a schematic circuit diagram showing the detailed structure of an average value outputting part 73 shown in FIG. 8.

FIG. 9 shows a schematic circuit structure showing the detailed structure of the average value outputting part 73 shown in FIG. 8. In FIG. 9, an output of the preamplifier 72 is inputted into both a maximum value detecting part 81 detecting and storing a maximum value of an input signal, and a minimum value detecting part 82 detecting and storing a minimum value of the input signal. An output of the maximum value detecting part 81 and an output of the minimum value detecting part 82 are first resistance-divided by a resistance dividing circuit constituted by resistors 831 and 832 before outputted. Note that resistance values of the resistors 831 and 832 are set equal. Accordingly, the resistance dividing circuit constituted by the resistors 831 and 832 outputs a center value of the output of the maximum value detecting part 81 and the output of the minimum value detecting part 82.

FIGS. 10a, 10b, 10c, 10d, 10e show waveforms of a signal in the respective parts of the optical receiver shown in FIG. 8.

Figure 10A:
FIGS. 10a, 10b, 10c, 10d, 10e show waveform diagrams of a signal in the respective parts of the optical receiver shown in FIG. 8.

In FIG. 10(a), a waveform 1101 denotes a waveform of an optical signal to be inputted into the optical-to-electrical conversion device 71.

Figure 10B:
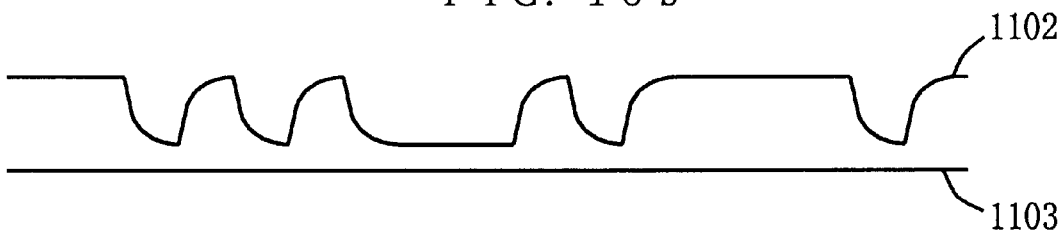

In FIG. 10(b), a waveform 1102 denotes a waveform of a voltage signal converted in the preamplifier 72, a waveform 1103 denotes a waveform of an output signal of the average value outputting part 73, respectively. An output of the preamplifier 72 may output a signal having a slight amplitude in some cases. In that case, an error may be relatively large by the maximum value detecting part 81 and the minimum value detecting part 82. This drawing shows a case where an error is large and be considerably deviated from the practical average value.

Figure 10C:
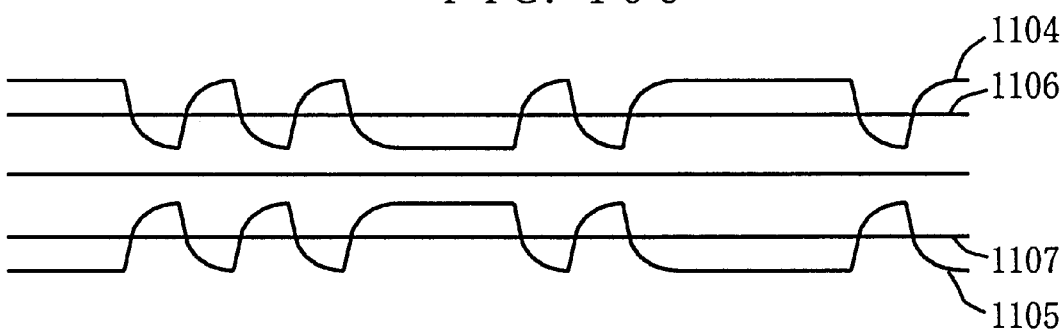

In FIG. 10(c), a waveform 1104 denotes a signal waveform of a positive-phase output of the first differential amplifier 11, and a waveform 1105 denotes a signal waveform of a negative-phase output of the first differential amplifier 11, respectively. In FIG. 10(c), a waveform 1106 denotes a signal waveform of a positive-phase output of the second differential amplifier 76, and a waveform 1107 denotes a signal waveform of a negative-phase output of the second differential amplifier 76, respectively. As described in the first embodiment, the positive-phase output 1106 of the second differential amplifier 14 is set equal to a center value of the positive-phase output 1104 of the first differential amplifier 11. Further, the negative-phase output 1107 of the second differential amplifier 14 is set equal to a center value of the negative-phase output 1105 of the first differential amplifier 11.

Figure 10D:
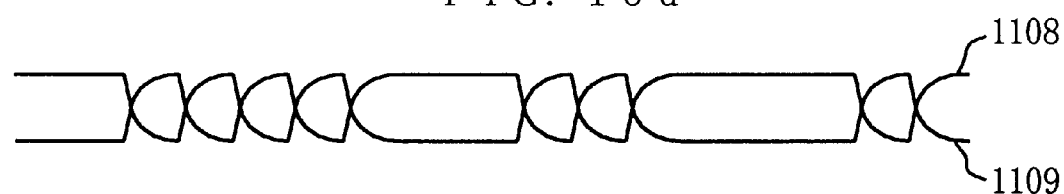
Figure 10E:
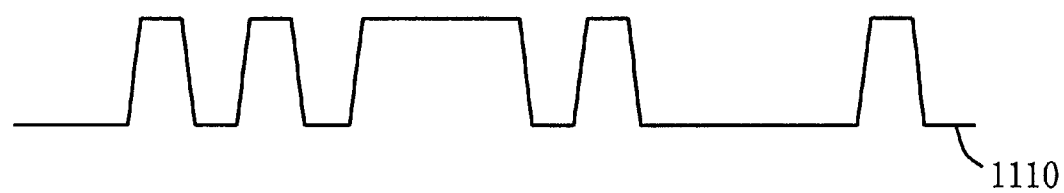

In FIG. 10(d), a waveform 1108 denotes a signal waveform of a positive-phase output of the combined differential amplifier 15, and a waveform 1109 denotes a signal waveform of a negative-phase output of the combined differential amplifier 15, respectively.

As described in the first embodiment, the average value level of the signal waveforms 1108 and 1109 coincide with each other. Therefore, if both signals are treated as signal input and reference input of the comparator 78, respectively, the comparator 78 outputs a pulse signal precisely corresponding to the received optical signal as denoted by a waveform 1110 in FIG. 10(e). That is, the comparator 78 treats reference input as a threshold value and discriminates the reference input from signal input so as to form the signal input into a digital waveform as denoted by the waveform 1110.

Even if an output signal from the average value outputting part 73 includes an offset with respect to an output signal from the preamplifier 72, as described above, signals can be correctly reproduced.

Fourth Embodiment

Figure 11:
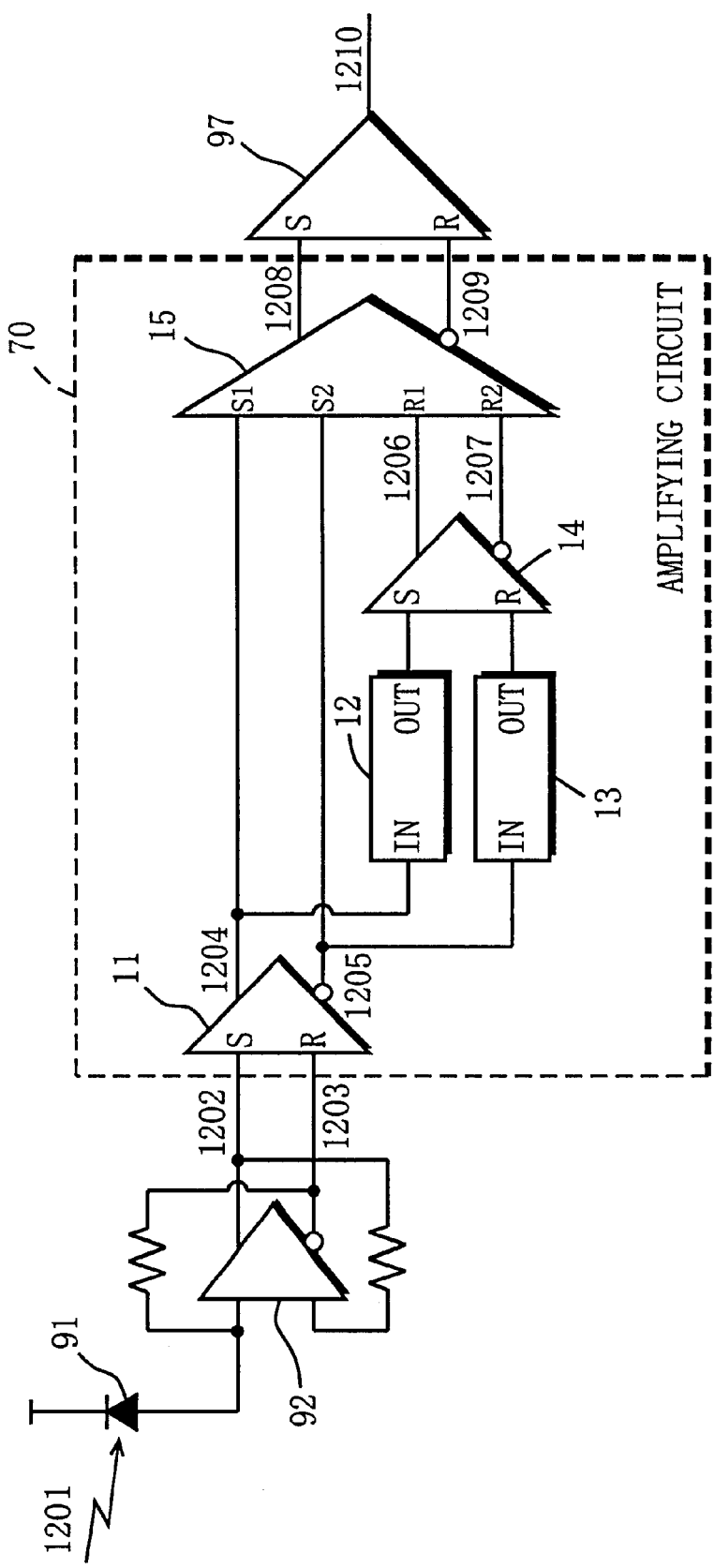
FIG. 11 is a block diagram showing the structure of an optical receiver according to a fourth embodiment of the present invention.

FIG. 11 is a block diagram showing the structure of an optical receiver according to a fourth embodiment of the present invention. In FIG. 11, the optical receiver of this embodiment is constructed by an amplifying circuit 70 having the same circuit structure as the amplifying circuit described in the first embodiment (refer to FIG. 1). The optical receiver of this embodiment further includes an optical-to-electrical conversion device 91, a preamplifier 92, and a comparator 97.

The optical-to-electrical conversion device 91 converts an optical signal to be inputted into a current signal. The preamplifier 92 is capable of differential inputting/outputting, and converts the current signal outputted from the optical-to-electrical conversion device 91 into a voltage signal.

As the structure of the amplifying circuit 70 has been described in the foregoing, it is not described here again. Note that in the first differential amplifier 11, the signal input terminal S receives a positive-phase output of the preamplifier 92, and the reference input terminal R receives a negative-phase output of the preamplifier 92.

In a comparator 97, the signal input terminal S receives a positive-phase output of the combined differential amplifier 15, and the reference input terminal R receives a negative-phase output of the combined differential amplifier 15.

FIGS. 12a, 12b, 12c, 12d, 12e show waveforms of a signal in the respective parts of the optical receiver shown in FIG. 10.

Figure 12A:
FIGS. 12a, 12b, 12c, 12d, 12e show waveform diagrams of a signal in the respective parts of the optical receiver shown in FIG. 10.

In FIG. 12(a), a waveform 1201 denotes a waveform of an optical signal to be inputted into the optical-to-electrical conversion device 91.

Figure 12B:
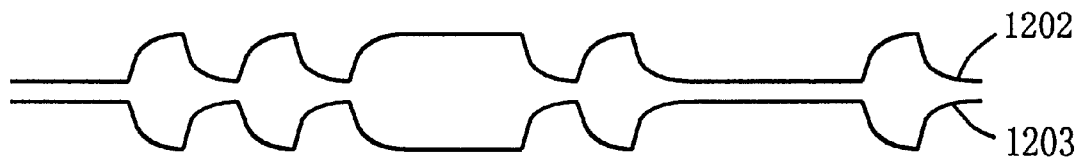

In FIG. 12(b), a waveform 1202 denotes a voltage signal waveform of the positive-phase output of the preamplifier 92, a waveform 1203 denotes a voltage signal waveform of the negative-phase output of the preamplifier 92, respectively. Receiving no optical signal input, output levels of the positive-phase output and the negative-phase output of the preamplifier 92 are supposed to be equal. However, if an extinction ratio of an optical signal to be inputted is deteriorated or if an offset voltage is included in a differential input, the levels of the positive-phase output and the negative-phase output of the preamplifier 92 will be caused to be different.

Figure 12C:
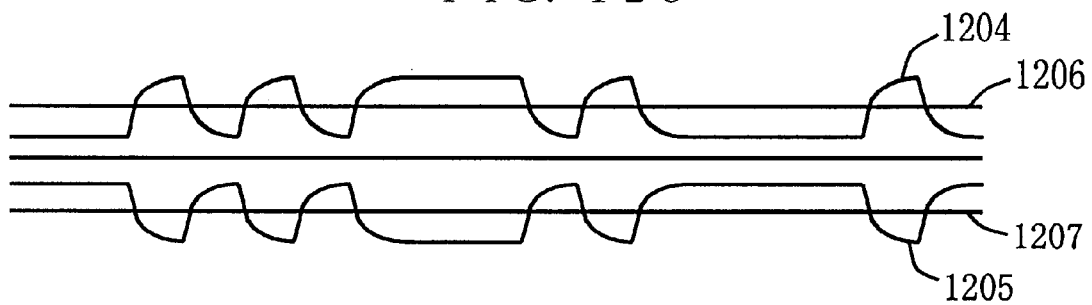

In FIG. 12(c), a waveform 1204 denotes a signal waveform of a positive-phase output of the first differential amplifier 11, and a waveform 1205 denotes a signal waveform of a negative-phase output of the first differential amplifier 11, respectively. In FIG. 12(c), a waveform 1206 denotes a signal waveform of a positive-phase output of the second differential amplifier 14, and a waveform 1207 denotes a signal waveform of a negative-phase output of the second differential amplifier 14, respectively. As described in the first embodiment, the positive-phase output 1206 of the second differential amplifier 14 coincides with a center value of the positive-phase output 1204 of the first differential amplifier 11. Also, the negative-phase output 1207 of the second differential amplifier 14 coincides with a center value of the negative-phase output 1205 of the first differential amplifier 11.

Figure 12D:
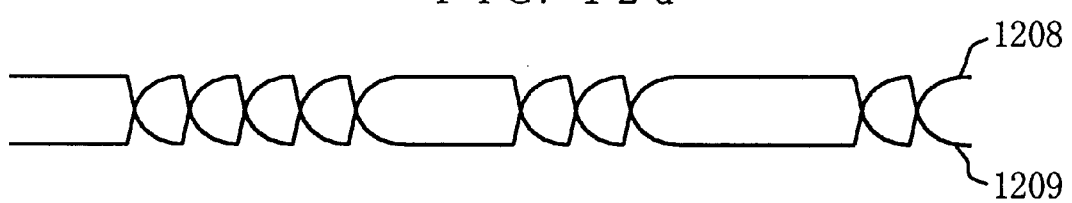
Figure 12E:
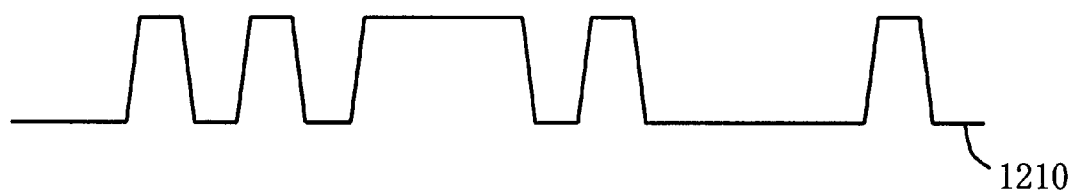

In FIG. 12(d), a waveform 1209 denotes a signal waveform of a positive-phase output of the combined differential amplifier 15, and a waveform 1208 denotes a signal waveform of a negative-phase output of the combined differential amplifier 15, respectively.

The signal waveforms 1208 and 1209, as described in the first embodiment, have average values of an equal level. Therefore, by treating both signals as signal input and reference input of the comparator 97, respectively, the comparator 97 outputs a pulse signal precisely corresponding to the received optical signal as denoted by a waveform 1210 in FIG. 12(e). That is, the comparator 97 treats reference input as a threshold value and discriminates the reference input from signal input so as to form the signal input into a digital waveform as denoted by the waveform 1210.

In the above-described first to fourth embodiments, a process whereby a mono-polarity signal is converted into a bi-polarity signal is described next below. Herein, a process how a mono-polarity signal is converted into a bi-polarity signal in the amplifying circuit shown in FIG. 1 is described as a typical example with reference-to the waveforms shown in FIG. 13a, 13b, 13c. It should be noted that the process of conversion is also performed in a similar manner to the other embodiments.

Figure 13A:
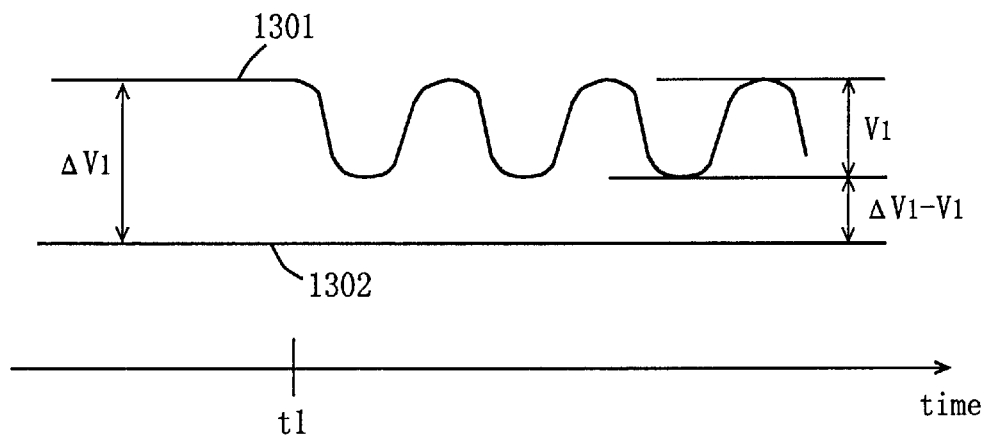
FIGS. 13a, 13b, 13c show waveform diagrams describing a process how a mono-polarity signal is converted into a bi-polarity signal in the amplifying circuit shown in FIG. 1.

In FIG. 13(a), a waveform 1301 denotes a signal waveform to be inputted into the signal input terminal S of the first differential amplifier 11, and a waveform 1302 denotes a signal waveform to be inputted into the reference input terminal R of the first differential amplifier 11. The signal waveform 1301 shows a head of burst signal, and after a lapse of t1 corresponding to "0" having no signal input, an alternate signal of "1" and "0" is generated. This waveform 1301 shows a form of mono-polarity signal in which a signal amplitude is generated in the direction that lowers the voltage when a value of "1" is appeared with reference to a value of "0" indicating no signal. It is assumed here that a level corresponding to the value of "0" with respect to the reference level 1302 is $\Delta V_1$, and a level difference between the value of "0" and the value of "1" is $V_1$.

Figure 13B:
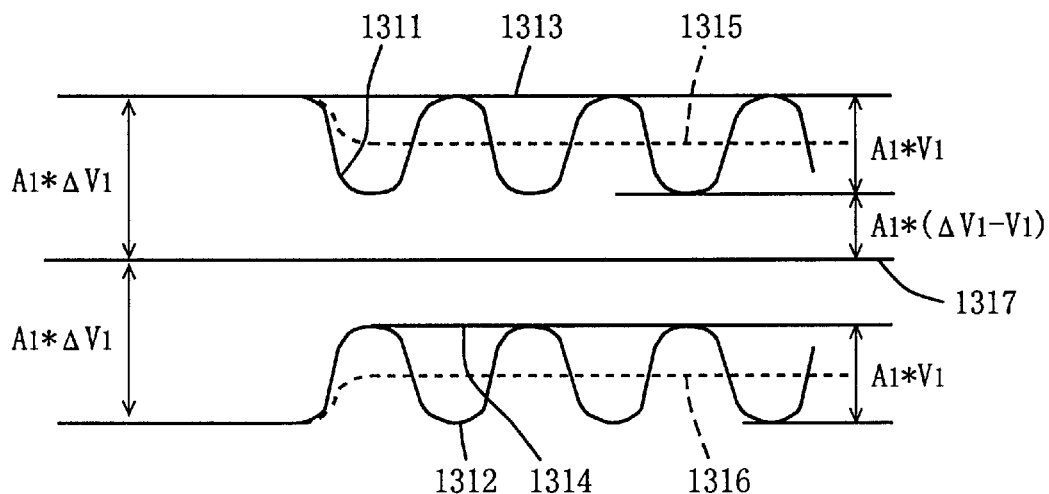

In FIG. 13(b), a waveform 1311 denotes a positive-phase output signal of the first differential amplifier 11, a waveform 1312 denotes a negative-phase output signal of the first differential amplifier 11, a waveform 1313 denotes an output signal of the first peak detecting part 12, and a waveform 1314 denotes an output signal of the second peak detecting part 13, respectively. A waveform 1315 denotes a positive-phase output signal of the second differential amplifier 14, and a waveform 1316 denotes a negative-phase output signal of the second differential amplifier 14, respectively. And a waveform 1317 denotes an offset voltage value of the first differential amplifier 11 and the second differential amplifier 14 receiving no signal input.

Figure 13C:
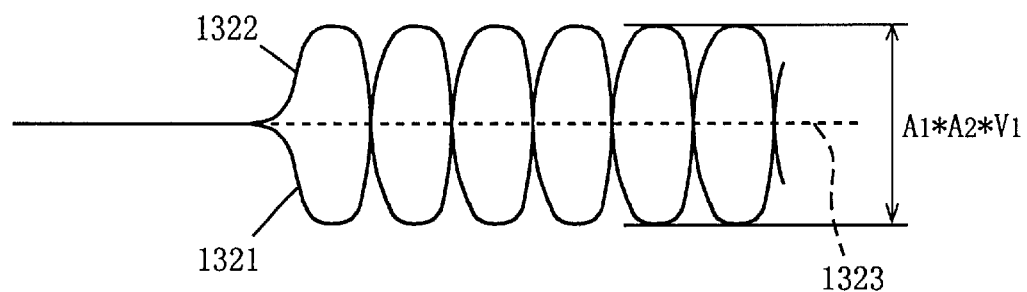

In FIG. 13(c), a waveform 1321 denotes a positive-phase output signal of the combined differential amplifier 15, and a waveform 1322 denotes a negative-phase output signal of the combined differential amplifier 15, respectively. In addition, a waveform 1323 denotes an offset voltage value of the combined differential amplifier 15 receiving no signal input. It is assumed here that a gain of the differential amplifier 11 is $A_1$, and a gain of the differential amplifier 15 is $A_2$.

Before a lapse of t1, the positive-phase output 1311 of the first differential amplifier coincides with the output 1313 of the first peak detecting part 12, and the negative-phase output 1312 of the first differential amplifier coincides with the output 1314 of the second peak detecting part 13. In the second differential amplifier 14, gains of the positive-phase output and the negative-phase output are both set to be 0.5. If the offset voltage value 1317 is assumed to be $V_{OS11}$, the positive-phase output $V_{out14}$ and the negative-phase output/$V_{out14}$ of the second differential amplifier 14 are respectively represented by the following equations (16) and (17), where an output of the first peak detecting part 12 is $V_{max12}$, and an output of the second peak detecting part 13 is $V_{max13}$.

$$V_{out14}=V_{OS11}+0.5^*(V_{max12}-V_{max13})=V_{OS11}+0.5^*\{V_{OS11}+A_1^*\Delta V_1)-(V_{OS11}-A_1^*\Delta V_1)\}=V_{OS11}+A_1^*\Delta V_1 \quad (16)$$

$$/V_{out14}=V_{OS11}-0.5^*(V_{max12}-V_{max13})=V_{OS11}-0.5^*\{V_{OS11}+A_1^*\Delta V_1-(V_{OS11}-A_1^*\Delta V_1)\}=V_{OS11}-A_1^*\Delta V_1 \quad (17)$$

To be specific, the positive-phase output 1315 of the second differential amplifier 14 coincides with the positive-phase output 1311 of the first differential amplifier. Further, the negative-phase output 1316 of the second differential amplifier 14 coincides with the negative-phase output 1312 of the first differential amplifier. Therefore, the positive-phase output 1321 and the negative-phase output 1322 of the combined differential amplifier 15 become equal to a voltage value denoted by a waveform 1323 being an offset voltage when there is no signal input.

Next, after a lapse of t1, the output 1313 of the first peak detecting part 12 shows no change. On the other hand, the output 1314 of the second peak detecting part 13 detects and stores a peak value of $$\{V_{OS11}-A_1^*(\Delta V_1-V_1)\}$$

in accordance with the negative-phase output 1312 of the first differential amplifier 11. With this newly detected and stored peak value, the second differential amplifier 14 determines the positive-phase output $V_{out14}$ and the negative-phase output/$V_{out14}$ as represented by the following equations (18) and (19):

$$V_{out14}=V_{OS11}+0.5^*(V_{max12}-V_{max13})=V_{OS11}+0.5^*[V_{OS11}+A_1^*\Delta V_1-\{V_{OS11}-A_1^*(\Delta V_1-V_1)\}]=V_{OS11}+A_1^*\Delta V_1-0.5^*A_1^*V_1 \quad (18)$$

$$/V_{out14}=V_{OS11}-0.5^*(V_{max12}-V_{max13})=V_{OS11}-0.5^*[V_{OS11}+A_1^*\Delta V_1-\{V_{OS11}-A_1^*(\Delta V_1-V_1)\}]=V_{OS11}-A_1^*\Delta V_1+0.5^*A_1^*V_1 \quad (19)$$

As will be known from the foregoing equations (18) and (19), if a burst signal is inputted after a lapse of t1, the positive-phase output 1315 and the negative-phase output 1316 of the second differential amplifier 14 are respectively set to be a center value of the positive-phase output 1311 and the negative-phase output 1312 of the first differential amplifier 11. In this manner, in the combined differential amplifier 15, a signal is converted and takes a bi-polarity signal waveform in which the values of "1" and "0" appear at the same amplitude in both directions of lower and higher voltage by centering the level 1323 without input.

In the third and fourth embodiments, both phases (that is, the positive-phase output and the negative-phase output) of the bi-polarity signal outputted from the combined differential amplifier 15 are respectively provided as signal input and reference input of the comparator so as to perform pulse reproduction. With such structure, means for newly generating reference signals becomes unnecessary, and a circuit can be accordingly downsized. Furthermore, a common-mode noise component superimposing on each phase output can be eliminated, and an influence to be caused by a noise component generating in the amplifier and superimposing on each phase output signal can be reduced. Therefore, a resistance to a noise can be improved.

Fifth Embodiment

FIG. 14 is a block diagram showing the structure of an amplifying circuit according to a fifth embodiment of the present invention. In the above-described first, third and fourth embodiments, the first peak detecting part 12, the second peak detecting part 13, and the second differential amplifier 14 are provided in order to obtain a center value of the positive-phase output and a center value of the negative-phase output of the first differential amplifier 11. While in the fifth embodiment, the positive-phase output and the negative-phase output of the first differential amplifier 11 are separately filtered by low-pass filters 1411 and 1412 so as to obtain the respective center values thereof.

Similarly, in the second embodiment, in order to obtain a center value of the positive-phase output and a center value of the negative-phase output of the combined differential amplifier 61a (or 61b, 61c), the first peak detecting part 62a (or 62b, 62c), the second peak detecting part 63a (or 63b, 63c), and the differential amplifier 64a (or 64b, 64c) are provided. Instead of such structure, the positive-phase output and the negative-phase output of the combined differential amplifier 61a (or 61b, 61c) may be separately filtered by the low-pass filters so as to obtain the respective center values thereof.

Industrial Applicability

The present invention is suitable for such optical receiver that a burst-type signal transmitted through an optical transmitting path is received and amplified therein so as to reproduce an original pulse signal.

What is claimed is:

1. An amplifying circuit converting a mono-polarity input signal into a bi-polarity signal and amplifying the same, the amplifying circuit comprising:

a first amplifier amplifying said mono-polarity input signal, and differential-outputting the amplified result in the form of positive-phase output and negative-phase output;

a center value generating part generating a center value of the positive-phase output and a center value of the negative-phase output of said first amplifier, and outputting the respective center values as a first and second center values; and a second amplifier having a function of amplifying a difference $\{(V_{S1}-V_{R1})-(V_{S2}-V_{R2})\}$ between a difference $(V_{S1}-V_{R1})$ of a first input signal $(V_{S1})$ and a first reference signal $(V_{R1})$ and a difference $(V_{S2}-V_{R2})$ of a second input signal $(V_{S2})$ and a second reference signal $(V_{R2})$, wherein the first input signal is assigned the positive-phase output of said first amplifier, the first reference signal is assigned said first center value, the second input signal is assigned the negative-phase output of said first amplifier, and the second reference signal is assigned said second center value.

2. The amplifying circuit according to claim 1, wherein said center value generating part includes:

a first peak detector detecting and storing a peak value of the positive-phase output of said first amplifier;

a second peak detector detecting and storing a peak value of the negative-phase output of said first amplifier; and a third amplifier amplifying a difference between an output of said first peak detector and an output of said second peak detector, and differential-outputting the amplified result in the form of positive-phase output and negative-phase output, wherein said first center value is extracted from the positive-phase output of said third differential amplifier and said second center value is extracted from the negative-phase output thereof.

3. The amplifying circuit according to claim 2, wherein a value of positive-phase output and negative-phase output of said first amplifier receiving no signal input and a value of positive-phase output and negative-phase output of said third amplifier receiving no signal input are set to be equal.

4. The amplifying circuit according to claim 3, wherein an amplification factor of the positive-phase output with respect to a differential input of said third amplifier and an amplification factor of the negative-phase output with respect to the differential input of said third amplifier are both set around 0.5.

5. The amplifying circuit according to claim 4, wherein said first amplifier at least comprises:

a first and second transistors whose sources are connected to each other;

a first current source which is connected to the connected-to-each-other sources of said first and second transistors;

a first resistor interposed between a drain of said first transistor and a power-supply line; and a second resistor interposed between a drain of said second transistor and a power-supply line, and said third amplifier at least comprises:

a third and fourth transistors;

a second current source;

a third resistor interposed between a source of said third transistor and said second current source;

a fourth resistor interposed between a source of said fourth transistor and said second current source;

a fifth resistor interposed between a drain of said third transistor and a power-supply line; and a sixth resistor interposed between a drain of said fourth transistor and a power-supply line, wherein when a product of a resistance value of said first resistor and a current value set in said first current source is P1, a product of a resistance value of said second resistor and a current value set in said first current source is P2, a product of a resistance value of said fifth resistor and a current value set in said second current source is P3, and a product of a resistance value of said sixth resistor and a current value set in said second current source is P4, resistance values of said first, second, fifth and sixth resistors and current values set in said first and second current sources are selected to satisfy an equation of

P1=P2=P3=P4.

6. The amplifying circuit according to claim 5, wherein resistance values of said first, second, fifth and sixth resistors are selected to be equal to one another, resistance values of said third and fourth resistors are selected to be equal to each other, and the current value set in said first current source and the current value set in said second current source are selected to be equal to each other.

7. The amplifying circuit according to claim 2, wherein circuit structures of said first and second peak detectors are identical to each other.

8. The amplifying circuit according to claim 1, wherein said center value generating part comprises:

a first low-pass filter passing only a low-frequency component of the positive-phase output of said first amplifier; and a second low-pass filter passing only a low-frequency component of the negative-phase output of said first amplifier.

9. The amplifying circuit according to claim 1, wherein said first amplifier comprises a differential amplifier receiving said mono-polarity input signal as signal input, receiving a fixed voltage temporarily set with respect to a direct-current level of the input signal as reference input, and differential-amplifying the input signal in accordance with the fixed voltage.

10. An amplifying circuit converting a mono-polarity input signal into a bi-polarity signal and amplifying the same, the amplifying circuit comprising:

a plurality of basic amplifying parts to be cascade connected in multiple stages; and a first amplifier cascade-connected to a last basic amplifying part, having a function of amplifying a difference $\{(V_{S1}-V_{R1})-(V_{S2}-V_{R2})\}$ between a difference $(V_{S1}-V_{R1})$ of a first input signal $(V_{S1})$ and a first reference signal $(V_{R1})$ and a difference $(V_{S2}-V_{R2})$ of a second input signal $(V_{S2})$ and a second reference signal $(V_{R2})$, and differential-outputting the amplified result in the form of positive-phase output and negative-phase output, and each of said basic amplifying parts comprising:

a second amplifier having a function of amplifying a difference $\{(V_{S1}-V_{R1})-(V_{S2}-V_{R2})\}$ between a difference $(V_{S1}-V_{R1})$ of a first input signal $(V_{S1})$ and a first reference signal $(V_{R1})$ and a difference $(V_{S2}-V_{R2})$ of a second input signal $(V_{S2})$ and a second reference signal $(V_{R2})$, and differential-outputting the amplified result in the form of positive-phase output and negative-phase output; and a center value generating part generating a center value of the positive-phase output and a center value of the negative-phase output of the first amplifier, and outputting the respective center values as a first and second center values, wherein said second amplifier in a first basic amplifying part differential-amplifies said mono-polarity input signal, said second amplifier in a second basic amplifying part and thereafter receives a positive-phase output and a negative-phase output of the second amplifier in the preceding basic amplifying part as said first and second input signals, and receives said first and second center values outputted from said center value generating part in the preceding basic amplifying part as said first and second reference signals, respectively, and said first amplifier receives a positive-phase output and a negative-phase output of the second amplifier in the last basic amplifying part as said first and second input signals, respectively, and receives said first and second center values outputted from said center value generating part in the last basic amplifying part as said first and second reference signals, respectively.

11. The amplifying circuit according to claim 10, wherein said center value generating part provided in each of said basic amplifying parts comprises:
- a first peak detector detecting and storing a peak value of the positive-phase output of said second amplifier;
- a second peak detector detecting and storing a peak value of the negative-phase output of said second amplifier; and
- a third amplifier amplifying a difference between an output of said first peak detector and an output of said second peak detector, and differential-outputting the amplified result in the form of positive-phase output and negative-phase output, wherein said first center value is extracted from the positive-phase output of said third differential amplifier and said second center value is extracted from the negative-phase output thereof.

12. The amplifying circuit according to claim 11, wherein a value of positive-phase output and negative-phase output of said second amplifier receiving no signal input and a value of positive-phase output and negative-phase output of said third amplifier receiving no signal input are set to be equal.

13. The amplifying circuit according to claim 12, wherein an amplification factor of the positive-phase output with respect to a differential input of said third amplifier and an amplification factor of the negative-phase output with respect to the differential input of said third amplifier are both set around 0.5.

14. The amplifying circuit according to claim 11, wherein circuit structures of said first and second peak detectors are identical to each other.

15. The amplifying circuit according to claim 10, wherein said center value generating part provided in each of said basic amplifying parts comprises:
- a first low-pass filter passing only a low-frequency component of the positive-phase output of said first amplifier; and
- a second low-pass filter passing only a low-frequency component of the negative-phase output of said first amplifier.

16. An optical receiver converting an optical signal into an electric signal and amplifying the same, the optical receiver comprising:
- an optical-to-electrical conversion device converting said optical signal into a current signal;
- a preamplifier converting an output signal of said optical-to-electrical conversion device into a voltage signal;
- an average value outputting part outputting an average value of output signal of said preamplifier;
- a first amplifier amplifying a difference between an output of said preamplifier and an output of said average value outputting part, and differential-outputting the amplified result in the form of positive-phase output and negative-phase output;
- a center value generating part generating a center value of the positive-phase output and a center value of the negative-phase output of said first amplifier, and outputting the center values as a first and second center values, respectively; and
- a second amplifier having a function of amplifying a difference $\{(V_{S1}-V_{R1})-(V_{S2}-V_{R2})\}$ between a difference $(V_{S1}-V_{R1})$ of a first input signal $(V_{S1})$ and a first reference signal $(V_{R1})$ and a difference $(V_{S2}-V_{R2})$ of a second input signal $(V_{S2})$ and a second reference signal $(V_{R2})$, wherein the first input signal is assigned the positive-phase output of said first differential amplifier, the first reference signal is assigned said first center value, the second input signal is assigned the negative-phase output of said differential amplifier, and the second reference signal is assigned said second center value.

17. The optical receiver according to claim 16, wherein said center value generating part comprises:
- a first peak detector detecting and storing a peak value of the positive-phase output of said first amplifier;
- a second peak detector detecting and storing a peak value of the negative-phase output of said first amplifier; and
- a third amplifier amplifying a difference between an output of said first peak detector and an output of said second peak detector, and differential-outputting the amplified result in the form of positive-phase output and negative-phase output, wherein said first center value is extracted from the positive-phase output of said third differential amplifier and said second center value is extracted from the negative-phase output thereof.

18. The optical receiver according to claim 17, wherein a value of positive-phase output and negative-phase output of said first amplifier receiving no signal input and a value of positive-phase output and negative-phase output of said third amplifier receiving no signal input are set to be equal.

19. The optical receiver according to claim 18, wherein an amplification factor of the positive-phase output with respect to a differential input of said third amplifier and an amplification factor of, the negative-phase output with respect to the differential input of said third amplifier are both set around 0.5.

20. The optical receiver according to claim 19, wherein said first amplifier at least comprises:
- a first and second transistors whose sources are connected to each other;
- a first current source which is connected to the connected-to-each-other sources of said first and second transistors;
- a first resistor interposed between a drain of said first transistor and a power-supply line; and
- a second resistor interposed between a drain of said second transistor and a power-supply line, wherein said third amplifier at least comprises:
- a third and fourth transistors;
- a second current source;
- a third resistor interposed between a source of said third transistor and said second current source;
- a fourth resistor interposed between a source of said fourth transistor and said second current source;
- a fifth resistor interposed between a drain of said third transistor and a power-supply line; and
- a sixth resistor interposed between a drain of said fourth transistor and a power-supply line, wherein when a product of a resistance value of said first resistor and a current value set in said first current source is P1, a product of a resistance value of said second resistor and a current value set in said first current source is P2, a product of a resistance value of said fifth resistor and a current value set in said second current source is P3, and a product of a resistance value of said sixth resistor and a current value set in said second current source is P4, resistance values of said first, second, fifth and sixth resistors and current values set in said first and second current sources are selected to satisfy an equation of

P1=P2=P3=P4.

21. The optical receiver according to claim 20, wherein resistance values of said first, second, fifth and sixth resistors are selected to be equal to one another, the resistance values of said third and fourth resistors are selected to be equal to each other, and the current value set in said first current source and the current value set in said second current source are selected to be equal to each other.

22. The optical receiver according to claim 17, wherein circuit structures of said first and second peak detectors are identical to each other.

23. The optical receiver according to claim 16, wherein said center value generating part comprises:

a first low-pass filter passing only a low-frequency component of the positive-phase output of said first amplifier; and a second low-pass filter passing only a low-frequency component of the negative-phase output of said first amplifier.

24. The optical receiver according to claim 16, wherein said second amplifier differential-outputs the amplified result in the form of positive-phase output and negative-phase output, and further comprises a comparator forming the result amplified by the second amplifier into a digital waveform by treating either the positive-phase output or the negative-phase output of said second amplifier as a threshold value to discriminate from the other.

25. An optical receiver converting an optical signal into an electric signal and amplifying the same, comprising:

an optical-to-electrical conversion device converting said optical signal into a current signal;

a preamplifier extracting an output signal of said optical-to-electrical conversion device as a differential voltage signal between a positive-phase output and a negative-phase output;

a first amplifier amplifying a difference between the positive-phase output and the negative-phase output of said preamplifier, and then differential-outputting the amplified result in the form of positive-phase output and negative-phase output;

a center value generating part generating a center value of the positive-phase output of said first amplifier and a center value of the negative-phase output thereof and outputting the same as a first and second center values, respectively; and a second amplifier having a function of amplifying a difference $\{(V_{S1}-V_{R1})-(V_{S2}-V_{R2})\}$ between a difference $(V_{S1}-V_{R1})$ of a first input signal $(V_{S1})$ and a first reference signal $(V_{R1})$ and a difference $(V_{S2}-V_{R2})$ of a second input signal $(V_{S2})$ and a second reference signal $(V_{R2})$, wherein the first input signal is assigned the positive-phase output of said differential amplifier, the first reference signal is assigned said first center value, the second input signal is assigned the negative-phase output of said differential amplifier, and the second reference signal is assigned said second center value.

26. The optical receiver according to claim 25, wherein said center value generating part comprises:

a first peak detector detecting and storing a peak value of the positive-phase output of said first amplifier;

a second peak detector detecting and storing a peak value of the negative-phase output of said first amplifier; and a third amplifier amplifying a difference between an output of said first peak detector and an output of said second peak detector, and then differential-outputting the amplified result in the form of positive-phase output and negative-phase output, wherein said first center value is extracted from the positive-phase output of said third differential amplifier, and said second center value is extracted from the negative-phase output thereof.

27. The optical receiver according to claim 26, wherein a value of positive-phase output and negative-phase output of said first amplifier receiving no signal input and a value of positive-phase output and negative-phase output of said third amplifier receiving no signal input are set to be equal.

28. The optical receiver according to claim 27, wherein an amplification factor of the positive-phase output with respect to a differential input of said third amplifier and an amplification factor of the negative-phase output with respect to the differential input of said third amplifier are both set around 0.5.

29. The optical receiver according to claim 28, wherein said first amplifier at least comprises:

a first and second transistors whose sources are connected to each other;

a first current source which is connected to the connected-to-each-other sources of said first and second transistors;

a first resistor interposed between a drain of said first transistor and a power-supply line; and a second resistor interposed between a drain of said second transistor and a power-supply line, and said third amplifier at least comprising:

a third and fourth transistors;

a second current source;

a third resistor interposed between a source of said third transistor and said second current source;

a fourth resistor interposed between a source of said fourth transistor and said second current source;

a fifth resistor interposed between a drain of said third transistor and a power-supply line; and a sixth resistor interposed between a drain of said fourth transistor and a power-supply line, wherein when a product of a resistance value of said first resistor and a current value set in said first current source is P1, a product of a resistance value of said second resistor and a current value set in said first current source is P2, a product of a resistance value of said fifth resistor and a current value set in said second current source is P3, and a product of a resistance value of said sixth resistor and a current value set in said second current source is P4, resistance values of said first, second, fifth and sixth resistors and current values set in said first and second current sources are selected to satisfy an equation of

P1=P2=P3=P4.

30. The optical receiver according to claim 29, wherein resistance values of said first, second, fifth and sixth resistors are selected to be equal to one another, the resistance values of said third and fourth resistors are selected to be equal to each other, and the current value set in said first current source and the current value set in said second current source are selected to be equal to each other.

31. The optical receiver according to claim 26, wherein circuit structures of said first and second peak detectors are identical to each other.

32. The optical receiver according to claim 25, wherein said center value generating part comprises:
  a first low-pass filter passing only a low-frequency component of the positive-phase output of said first amplifier; and
  a second low-pass filter passing only a low-frequency component of the negative-phase output of said first amplifier.

33. The optical receiver according to claim 25, wherein said second amplifier differential-outputs the amplified result in the form of positive-phase output and negative-phase output, and
  further comprises a comparator forming the result amplified by the second amplifier into a digital waveform by treating either the positive-phase output or the negative-phase output of said second amplifier as a threshold value to discriminate from the other.

* * * * *